(12) United States Patent
Lee et al.

(10) Patent No.: US 12,557,454 B2
(45) Date of Patent: Feb. 17, 2026

(54) DIGITAL DISPLAY SYSTEM INCLUDING PIXEL-DRIVING CIRCUIT FORMED ON INTERPOSER

(71) Applicant: SAPIEN SEMICONDUCTORS INC., Gyeonggi-do (KR)

(72) Inventors: Myunghee Lee, Gyeonggi-do (KR); Kun Ho Song, Gyeonggi-do (KR); Jun Young Jung, Gyeonggi-do (KR)

(73) Assignee: Sapien Semiconductors Inc., Gyeonggi-do (KR)

( * ) Notice: Subject to any disclaimer, the term of this patent is extended or adjusted under 35 U.S.C. 154(b) by 22 days.

(21) Appl. No.: 18/581,138

(22) Filed: Feb. 19, 2024

(65) Prior Publication Data

US 2025/0022997 A1    Jan. 16, 2025

Related U.S. Application Data

(63) Continuation-in-part of application No. PCT/KR2023/009026, filed on Jun. 28, 2023.

(30) Foreign Application Priority Data

Jun. 29, 2022 (KR) .......... 10-2022-0079519
Aug. 11, 2022 (KR) .......... 10-2022-0100516
(Continued)

(51) Int. Cl.
*H10H 20/857* (2025.01)
*G09G 3/32* (2016.01)
*H01L 25/16* (2023.01)

(52) U.S. Cl.
CPC .......... *H10H 20/857* (2025.01); *G09G 3/32* (2013.01); *H01L 25/167* (2013.01);
(Continued)

(58) Field of Classification Search
CPC .......... G09G 2310/0289; G09G 3/32; G09G 2310/0286; G09G 2300/0452;
(Continued)

(56) References Cited

U.S. PATENT DOCUMENTS 8,624,882 B2    1/2014  Cok et al.
11,238,783 B2   2/2022  Lee
(Continued)

FOREIGN PATENT DOCUMENTS

CN     114582246 A      6/2022
KR   10-2014-0051145 A  4/2014
(Continued)

OTHER PUBLICATIONS

Office action for corresponding Korean application No. 10-2023-0057664 dated May 30, 2024.
(Continued)

*Primary Examiner* — Muhammad N Edun
(74) *Attorney, Agent, or Firm* — Eschweiler & Potashnik, LLC; Harris Kim

(57) ABSTRACT

A pixel-driving circuit for driving a digital display device, the pixel-driving circuit formed on an interposer that is electrically connected to a display substrate through a plurality of bumps. The pixel-driving circuit comprises a row terminal connected to a row bump connected to a row line of a row-driving circuit among the plurality of bumps, a column terminal connected to a column bump connected to a column line of a column-driving circuit among the plurality of bumps, a common element that shares at least one of the row terminal or the column terminal for L (L is a positive integer greater than or equal to 2) display pixels formed on the interposer, and L pixel individual elements connected to the common element and driving a plurality of light emitters included in each of the L display pixels.

11 Claims, 39 Drawing Sheets

(30) Foreign Application Priority Data

| Oct. 21, 2022 | (KR) | ........................ | 10-2022-0136814 |
| May 3, 2023 | (KR) | ........................ | 10-2023-0057664 |
| Jun. 13, 2023 | (KR) | ........................ | 10-2023-0075472 |

(52) U.S. Cl.
CPC ............... *G09G 2300/0452* (2013.01); *G09G 2310/0286* (2013.01); *G09G 2310/0289* (2013.01)

(58) Field of Classification Search
CPC .... G09G 20/857; H01L 25/167; H10H 29/39; H10H 29/45; H10H 29/34; H10H 29/49; H10D 86/00
See application file for complete search history.

(56) References Cited

U.S. PATENT DOCUMENTS

| 2019/0103426 | A1* | 4/2019 | Tanaka | ................ | H10F 39/8023 |
| 2019/0279558 | A1* | 9/2019 | Monestier | ............... | F21S 43/14 |
| 2020/0258966 | A1* | 8/2020 | Cha | ....................... | H10K 59/123 |
| 2022/0059636 | A1* | 2/2022 | Song | .................. | H10K 59/1315 |
| 2023/0253387 | A1* | 8/2023 | Lee | .......................... | G09G 3/32 |
| | | | | | 345/206 |
| 2023/0253388 | A1 | 8/2023 | Chung et al. | | |

FOREIGN PATENT DOCUMENTS

| KR | 1020170099025 B1 | 8/2017 |
| KR | 10-2017-0101056 A | 9/2017 |
| KR | 10-2019-0033438 A | 3/2019 |
| KR | 10-2019-0073015 A | 6/2019 |
| KR | 10-2347927 B1 | 1/2022 |
| KR | 10-2022-0072535 A | 6/2022 |
| KR | 10-2022-0076107 A | 6/2022 |
| KR | 20220072535 A | 6/2022 |
| KR | 10-2023-0008684 | 1/2023 |

OTHER PUBLICATIONS

International Search Report for corresponding International Application No. PCT/KR2023/009026 mailed Sep. 22, 2023.
Written Opinion for corresponding International Application No. PCT/KR2023/009026 dated Sep. 22, 2023.
Taiwanese Office Action Regarding TW application No. 112134893 dated Nov. 20, 2024.
Korean Notice of Allowance Issued on May 27, 2025; Application No. 10-2023-0057664; English translation.

* cited by examiner

2100

2210

2220

2230

2240

2250

2260

2270

2280

2290

2310

2320

DIGITAL DISPLAY SYSTEM INCLUDING PIXEL-DRIVING CIRCUIT FORMED ON INTERPOSER

CROSS-REFERENCE TO RELATED APPLICATIONS

This application is a continuation-in-part application of PCT International Application No. PCT/KR2023/009026, which was filed on Jun. 28, 2023, and claims priority to Korean Patent Application No. 10-2022-0079519, filed on Jun. 29, 2022, Korean Patent Application No. 10-2022-0100516, filed on Aug. 11, 2022, Korean Patent Application No. 10-2022-0136814, filed on Oct. 21, 2022, Korean Patent Application No. 10-2023-0057664, filed on May 3, 2023, and Korean Patent Application No. 10-2023-0075472, filed on Jun. 13, 2023, in the Korean Intellectual Property Office, the disclosures of each of which are incorporated herein by reference.

TECHNICAL FIELD

The present disclosure relates to digital display systems, and more particularly, to display pixels and pixel driving circuits thereof.

BACKGROUND

Displays using light-emitting diodes (LEDs) can be applied to a wide range of fields, from small mobile devices to digital signage displays. In particular, displays are being used in a wider range of fields, including various automotive devices and augmented reality (AR) and virtual reality (VR) devices.

Accordingly, improvements of the display are still required in various characteristics such as various sizes, flexible formfactors, high resolutions, manufacturing costs, high reliabilities, and fast response speeds.

In addition, the driving circuits for LED displays still require improvement in various characteristics.

BRIEF SUMMARY

One object of the present disclosure is to provide digital display systems with various characteristics improved.

In accordance with one aspect of the present disclosure, provided is a pixel-driving circuit, wherein the pixel-driving circuit is a pixel-driving circuit of a digital display device formed on an interposer that is electrically connected to a display substrate through a plurality of bumps, and includes a row terminal connected to a row bump connected to a row line of a row-driving circuit among the bumps; a column terminal connected to a column bump connected to a column line of a column-driving circuit among the bumps; a common element that shares at least one of the row terminal and the column terminal for L (L is a positive integer greater than or equal to 2) display pixels formed on the interposer; and L pixel individual elements connected to the common element and driving a plurality of light emitters included in each of the L display pixels.

The interposer may be any one of a film interposer, a glass interposer, and a silicon interposer.

The pixel-driving circuit may further include at least one sensor disposed on a sensor area formed on the interposer.

The common element may include a power generator for generating power needed for the pixel-driving circuit; and at least one of a column signal distributor for distributing a signal input through the column terminal to the 2L pixel individual elements and a row signal distributor for distributing a signal input through the row terminal to the 2L pixel individual elements.

Each of the 2L pixel individual elements may include a pixel-embedded memory for storing video data input through the column signal distributor.

Sub-pixel areas where a plurality of light emitters of each of the L display pixels is disposed may be formed at a corner or outside of a display pixel so that the sub-pixel areas are adjacent to each other.

In accordance with another aspect of the present disclosure, provided is a digital display device including display pixels arranged in M (M is a positive integer) rows and N (N is a positive integer) columns; and a plurality of pixel-driving circuits for driving the display pixels, wherein the M×N display pixels are divided into a plurality of macro pixels consisting of m×n (m is a positive integer less than M, n is a positive integer less than N) display pixels; each of the macro pixels is grouped with each of the corresponding pixel-driving circuits to form a plurality of groups, and the groups are formed on a plurality of interposers that are electrically connected to a substrate through a plurality of bumps; and each of the pixel-driving circuits is connected to at least one corresponding row line and at least one corresponding column line, and a signal input through at least one line of the row and column lines is distributed to m×n display pixels within a macro pixel grouped into the same group.

Each of the pixel-driving circuits may include a common element that shares m×n display pixels within a macro pixel grouped into the same group and at least one line of the row and column lines; and m×n pixel individual elements for driving a plurality of light emitters included in each of the m×n display pixels within the macro pixel connected to the common element and grouped into the same group.

The number of the row and column lines shared with the m×n display pixels may be determined based on at least one of a fill factor and an application type of a pixel-driving circuit, and the fill factor may be determined based on size design conditions of a pixel area of the display substrate and a sub-pixel area where the light emitters are disposed.

The application type of the pixel-driving circuit may be divided into a large-area display, a monitor display, and a mobile display, and the fill factor may be determined to have a small value in an order of a large-area display, a monitor display, and a mobile display.

The interposer may be any one of a film interposer, a glass interposer, and a silicon interposer.

Each of the pixel-driving circuits may further include at least one sensor disposed on a sensor area formed on a corresponding interposer.

Each of the display pixels may be disposed on a pixel area formed on a corresponding interposer; the pixel area may include sub-pixel areas where a plurality of light emitters are disposed and a non-active area excluding the sub-pixel areas; and each of the macro pixels may include a pixel-driving circuit area where a pixel-driving circuit is disposed, and at least a portion of the pixel-driving circuit area may overlap a plurality of non-active areas.

The sub-pixel areas may be formed at a corner or outside of a display pixel so that the sub-pixel areas are adjacent to each other.

Each of the m×n pixel individual elements may include a pixel-embedded memory for storing video data input through the column signal distributor; and a pixel driver for controlling driving of the light emitters based on the video data and a driving signal input through the row signal distributor.

The present disclosure may improve the assembling of the display device by mounting the LEDs and the pixel-driving circuit on an interposer and connecting the LEDs and the pixel-driving circuit to a display substrate.

According to the present disclosure, various characteristics of a digital display system can be improved through the following embodiments.

DETAILED DESCRIPTION

The present disclosure will now be described more fully with reference to the accompanying diagrams and contents disclosed in the diagrams. However, the present disclosure should not be construed as limited to the exemplary embodiments described herein.

The terms used in the present specification are used to explain a specific exemplary embodiment and not to limit the present inventive concept. Thus, the expression of singularity in the present specification includes the expression of plurality unless clearly specified otherwise in context. It will be further understood that the terms "comprise" and/or "comprising", when used in this specification, specify the presence of stated components, steps, operations, and/or elements, but do not preclude the presence or addition of one or more other components, steps, operations, and/or elements thereof.

It should not be understood that arbitrary aspects or designs disclosed in "embodiments", "examples", "aspects", etc. used in the specification are more satisfactory or advantageous than other aspects or designs.

In addition, the expression "or" means "inclusive or" rather than "exclusive or". That is, unless mentioned otherwise or clearly inferred from context, the expression "x uses a or b" means any one of natural inclusive permutations.

In addition, as used in the description of the disclosure and the appended claims, the singular form "a" or "an" is intended to include the plural forms as well, unless context clearly indicates otherwise.

In addition, terms such as "first" and "second" are used herein merely to describe a variety of constituent elements, but the constituent elements are not limited by the terms. The terms are used only for the purpose of distinguishing one constituent element from another constituent element.

Unless defined otherwise, all terms (including technical and scientific terms) used herein have the same meaning as commonly understood by one of ordinary skill in the art. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

In addition, in the following description of the present disclosure, a detailed description of known functions and configurations incorporated herein will be omitted when it may make the subject matter of the present disclosure unclear. The terms used in the specification are defined in consideration of functions used in the present disclosure, and can be changed according to the intent or conventionally used methods of clients, operators, and users. Accordingly, definitions of the terms should be understood on the basis of the entire description of the present specification.

Figure 1:
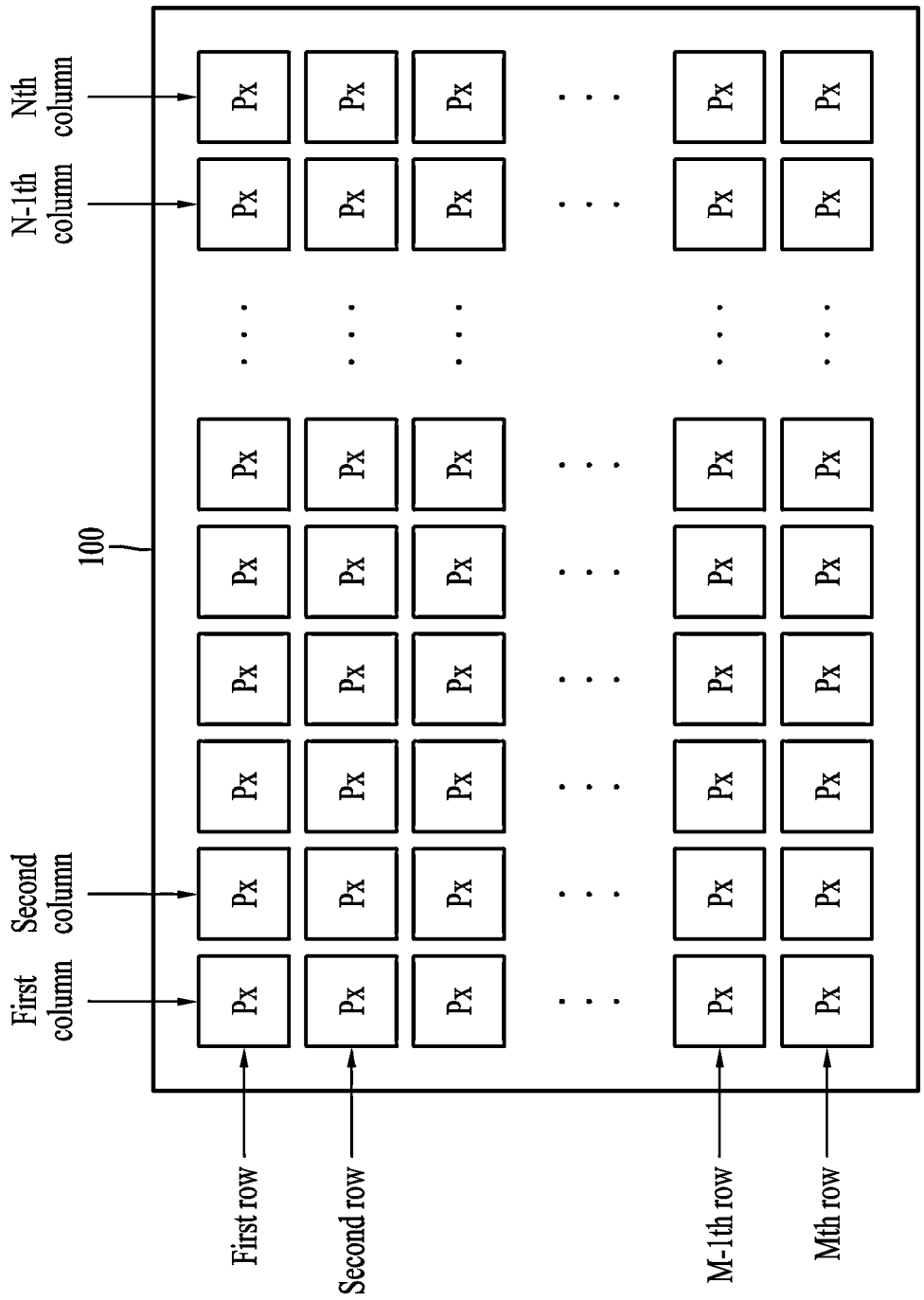
FIG. 1 is a diagram for illustrating a display pixel arrangement structure according to one embodiment.

Referring to FIG. 1, a display panel 100 includes a plurality of display pixels (Px) disposed or arranged in the form of a matrix M×N (M and N each are integers). Here, display pixels (Pxs) disposed into M rows and N columns may be referred to as an 'array of pixels'.

Accordingly, the array of pixels includes pixels disposed into M rows and N columns.

M rows may be referred to as 'row lines', and N columns may be referred to as 'column lines'.

At this time, the row line may be called a horizontal line, scan line, or gate line, and the column line may be called a vertical line or data line.

The terms row line, column line, horizontal line, and vertical line may be used to refer to the line formed by pixels on a pixel array, and the terms scan line, gate line, and data line may be used to refer to wiring on the display panel 100 through which data or signals are transmitted.

Each display pixel (Px) may include a plurality of light emitters. In this case, the light emitters may be inorganic light emitters.

Although not shown in FIG. 1, the display panel 100 may include a pixel-driving circuit provided for each display pixel (Px).

Figure 2:
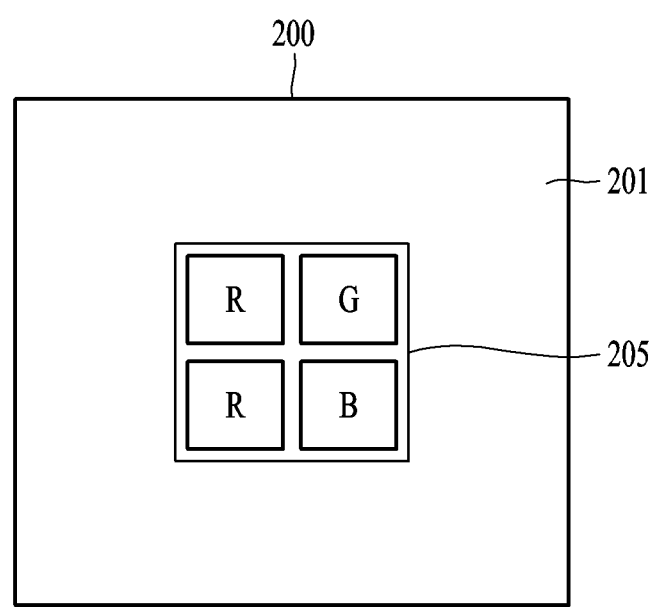
FIG. 2 is a diagram for illustrating the structure of the display pixel shown in FIG. 1.

FIG. 2 is a diagram for illustrating the structure of the display pixel shown in FIG. 1.

Referring to FIG. 2, a display pixel 200 includes a sub-pixel area 205 on which a plurality of light-emitting elements is disposed. Here, the sub-pixel area 205 may also be referred to as an 'active area'.

The part 201 of the display pixel 200 excluding the sub-pixel area 205 may be called a 'non-active area' or 'black area'.

The light-emitting elements may include three types of sub-pixels: a red (R) sub-pixel, a green (G) sub-pixel, and a blue (B) sub-pixel. That is, each of the light-emitting elements may be referred to as a sub-pixel. At this time, 1 or 2 red (R) sub-pixels may be included. Various combinations of the type and number of sub-pixels disposed in one display pixel are possible.

A fill factor for the array of display pixels may be determined depending on the area of the sub-pixel area 205 in the display pixel 200.

Here, the fill factor may be determined based on the size design conditions of the pixel area of a display substrate and the sub-pixel area where a plurality of light emitters is disposed.

For example, when the pitch of the display pixel 200 is 0.1 mm, the display panel 100 may be expressed as a '0.1 mm-pitch display panel'. At this time, the total surface area of the display pixel 200 is 0.01 mm$^2$. Red, green, and blue may each be implemented by light-emitting elements, and the size of each light-emitting element may be 0.0016 mm$^2$. In this case, since only one light-emitting element chip may emit light in normal display operation, the minimum fill factor F is 0.16 (1.6/10). In addition, the fill factor may be determined considering the total area of the sub-pixel area 205. For example, when the total area of the sub-pixel area 205 is 0.0048 mm$^2$, the fill factor F is 0.48.

Figure 3:
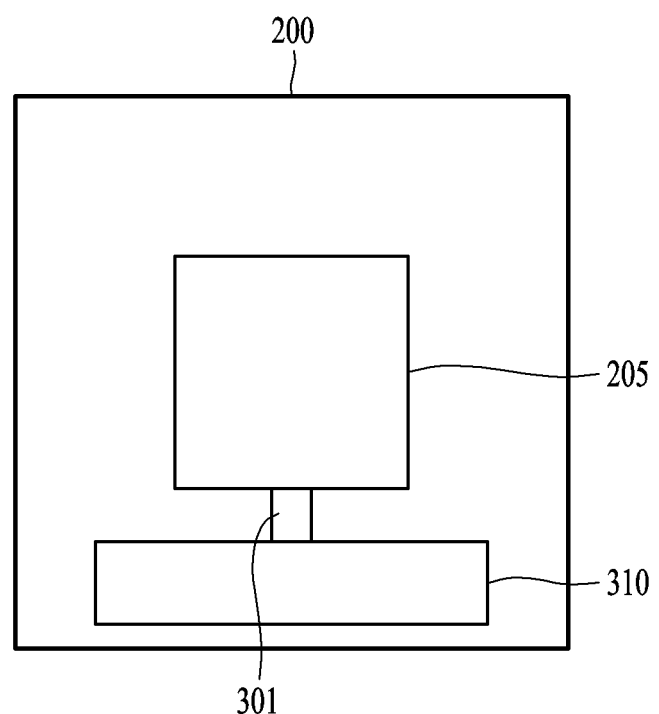
FIG. 3 is a diagram for illustrating an example of the arrangement structure of display pixels and a pixel-driving circuit according to the prior art.

FIG. 3 is a diagram for illustrating an example of the arrangement structure of display pixels and a pixel-driving circuit according to the prior art.

Referring to FIG. 3, a display pixel-driving circuit area 310 may be formed in the display pixel 200.

The display pixel-driving circuit area 310 may be a semiconductor wafer for forming a display pixel-driving circuit, e.g., a silicon semiconductor wafer.

The display pixel-driving circuit may be connected to light-emitting elements disposed on the sub-pixel area 205 through electrical wiring 301.

Figure 4A:
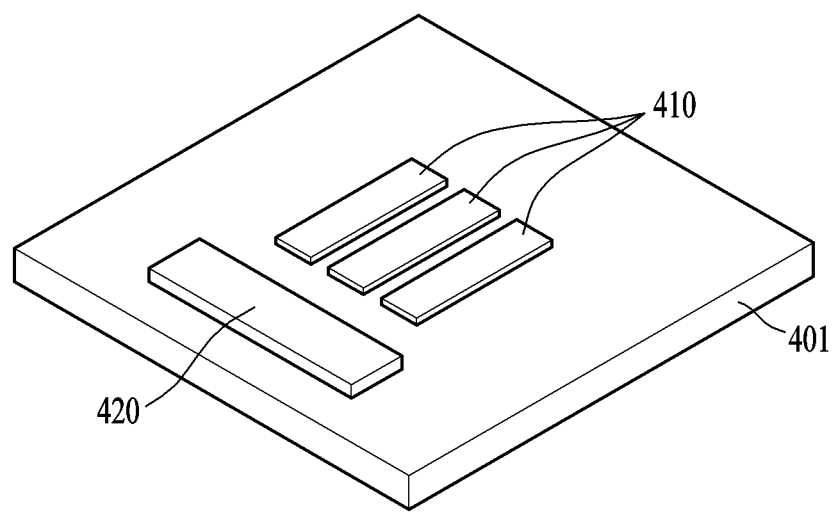
FIG. 4A and 4B are diagrams for illustrating other examples of the arrangement structure of display pixels and a pixel-driving circuit according to the prior art.
Figure 4B:
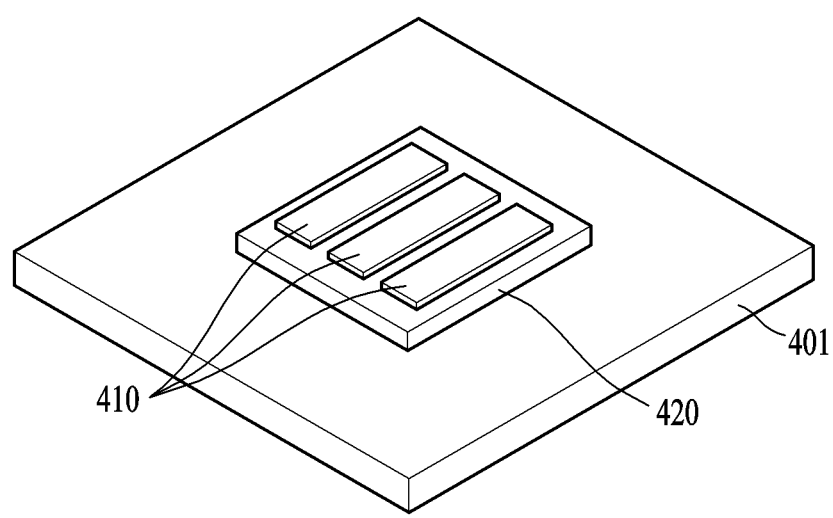

FIG. 4 includes diagrams for illustrating another example of the arrangement structure of display pixels and a pixel-driving circuit according to the prior art.

Referring to FIG. 4, a display pixel 401 of FIG. 4 (A) shows an example of forming, on the same layer, an area where light-emitting elements 410 are disposed and an area 420 where a pixel-driving circuit is formed.

The display pixel 401 of FIG. 4 (B) shows an example of forming, on different layers, an area where the light-emitting elements 410 are disposed and the area 420 where a pixel-driving circuit is formed.

For example, the area 420 where the pixel-driving circuit is formed may be a thin-film transistor (TFT) layer below the light-emitting elements. At this time, the pixel-driving circuit may exist for each light-emitting element corresponding to the TFT layer.

For convenience of explanation, the illustration of electrical wiring connecting the pixel-driving circuit and the light-emitting elements is omitted in FIG. 4.

Figure 5:
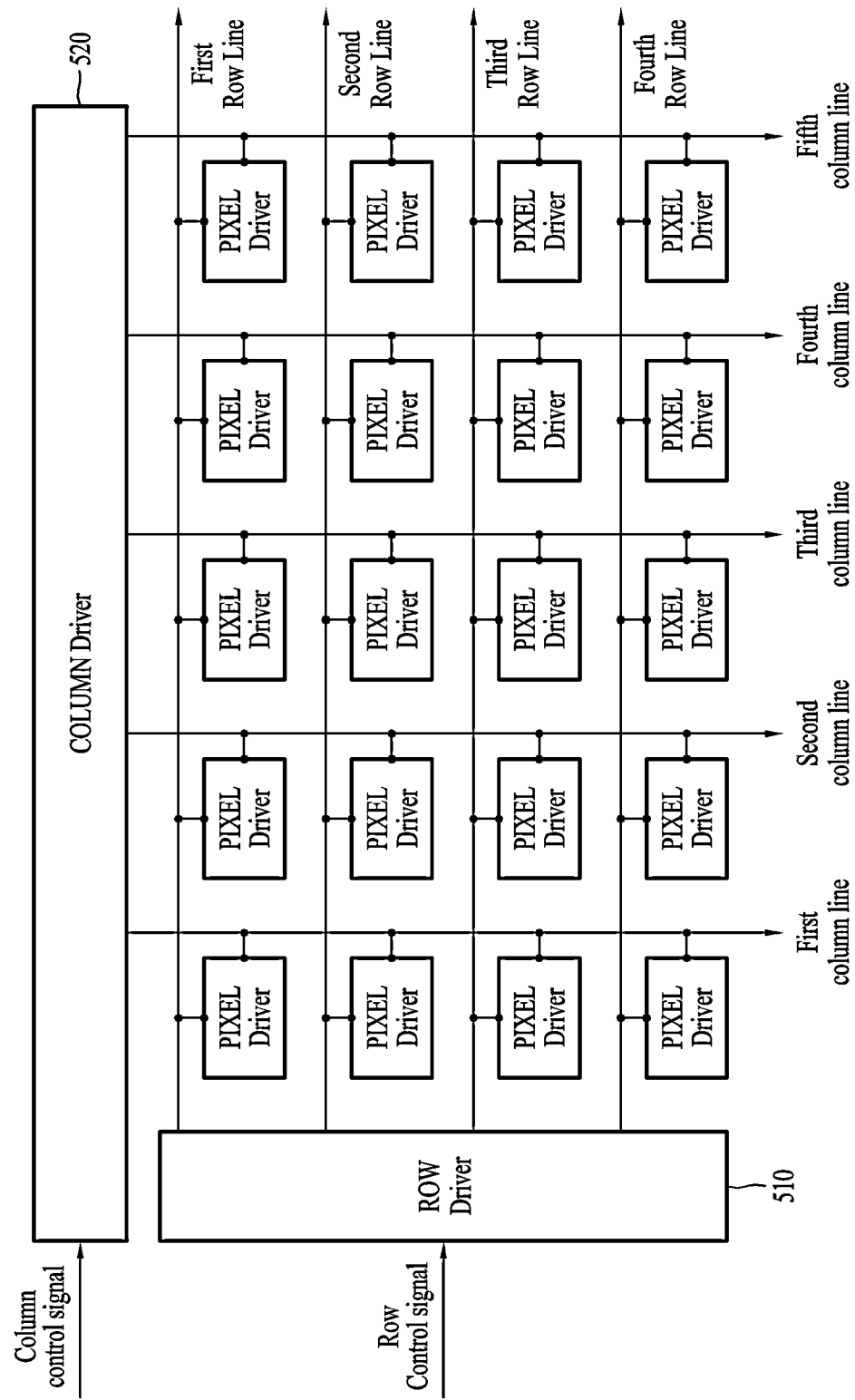
FIG. 5 is a diagram for illustrating the structure of a display-driving circuit according to the prior art.

FIG. 5 is a diagram for illustrating the structure of a display-driving circuit according to the conventional art.

Referring to FIG. 5, the display-driving circuit includes a row-driving circuit (ROW Driver) 510, a column-driving circuit (COLUMN Driver) 520, and pixel-driving circuits (Pixel Drivers) provided for each display pixel.

Each pixel-driving circuit may provide a driving current or voltage to the light-emitting element of the display pixel based on a video data inputted from the column-driving circuit 520. Here, the video data may include one or more bits data.

Each pixel-driving circuit may express the gradation of an image (gradation expression or tone expression) by providing a driving current to the light emitter for a time corresponding to a pulse width of a PWM signal.

The example shown in FIG. 5 may be applied to an array of display pixels disposed in the form of 4×5. Accordingly, the first to fifth column lines are required to supply column signals to 20 display pixels. In addition, 4 row lines are required to supply row signals to 20 display pixels.

Column lines and row lines corresponding to display pixels may be a factor in increasing electrical wiring and manufacturing costs.

Figure 6:
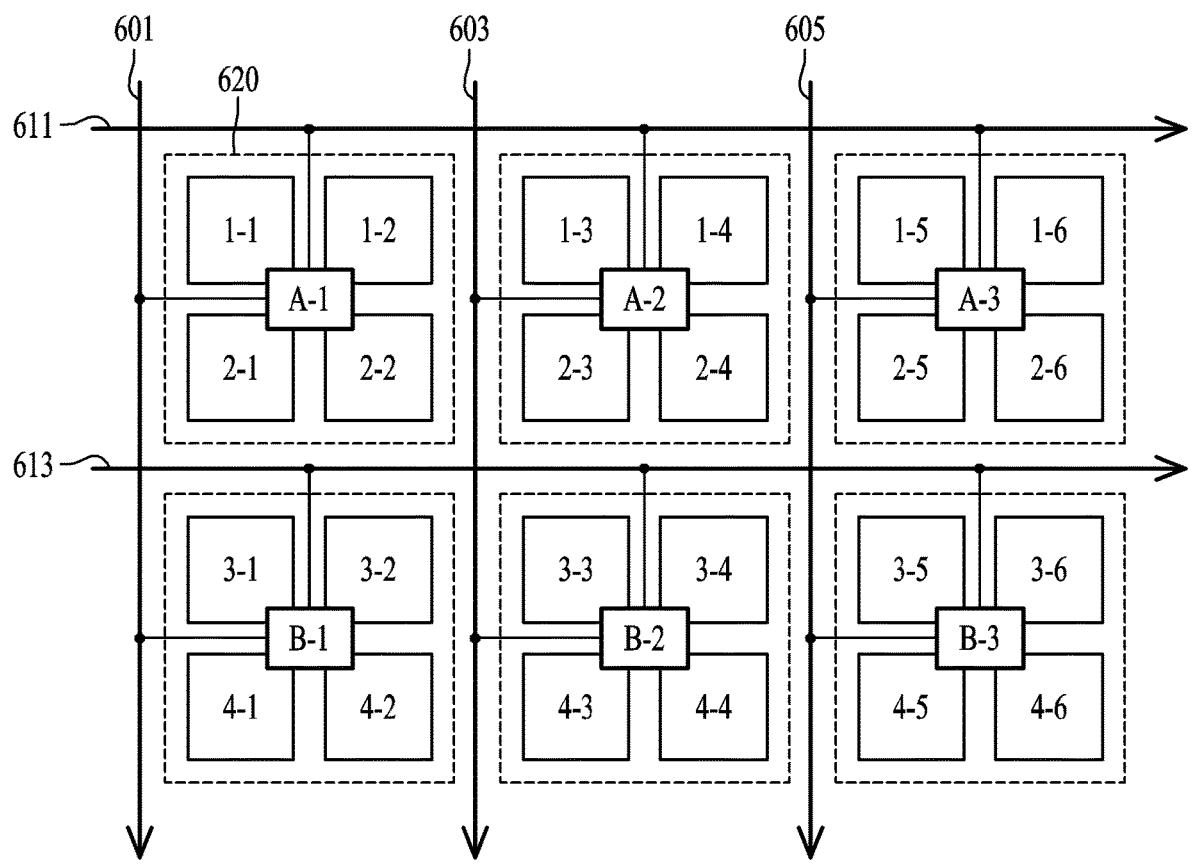
FIG. 6 is a diagram for illustrating a digital display device according to one embodiment of the present disclosure.

FIG. 6 is a diagram for illustrating a digital display device according to one embodiment of the present disclosure.

Referring to FIG. 6, the digital display device according to one embodiment may include display pixels (1-1, 1-2, . . . , 4-5) disposed into M (M is a positive integer) rows and N (N is a positive integer) columns and a plurality of pixel-driving circuits (A-1, A-2, . . . , B-3) for driving the display pixels (1-1, 1-2, . . . , 4-5).

In the example of FIG. 6, the digital display device according to one embodiment is a common interface-based display device and includes a plurality of pixel-driving circuits for driving display pixels. At this time, the pixel-driving circuits are 'common interface-based pixel-driving circuits'. For example, in FIG. 6, reference symbol A-1 is a common interface-based pixel-driving circuit for driving a first macro pixel 620.

Hereinafter, the 'common interface-based pixel-driving circuit' may simply be referred to as a pixel-driving circuit.

In addition, each display pixel is expressed in the format of 'row number-column number'. According to FIG. 6, M is 4 and N is 5, but the present disclosure is not limited thereto.

That is, for simplification and convenience of explanation, the simplified 4×5 form of display pixels is illustrated in FIG. 5. However, the number of display pixels may be increased as needed.

In the present disclosure, the concepts of 'macro pixel' and 'common interface' are introduced to reduce electrical wiring and improve device complexity.

Specifically, M×N display pixels may be divided into a plurality of macro pixels 620 consisting of m×n (m is a positive integer less than M, n is a positive integer less than N) display pixels.

In this specification, the term 'common interface' refers to an element that shares a column line or column terminal for a macro pixel.

The concepts of 'macro pixel' and 'common interface' will become clearer through later explanations.

In the example shown in FIG. 6, the values of m and n are 2. In addition, adjacent m×n display pixels may also be referred to as 'adjacent 2L (L is an integer) display pixels'. At this time, in the example shown in FIG. 6, the value of L is 2.

Accordingly, the M×N display pixels shown in FIG. 6 may be divided into a plurality of macro pixels consisting of m×n display pixels.

For example, the first macro pixel 620 may be a pixel group consisting of display pixels 1-1, 1-2, 2-1, and 2-2.

The common interface-based display device according to one embodiment includes a plurality of pixel-driving circuits for driving display pixels. Here, the pixel-driving circuits mean 'common interface-based pixel-driving circuits'. For example, in FIG. 6, reference symbol A-1 is a common interface-based pixel-driving circuit for driving the first macro pixel 620.

Hereinafter, a 'common interface-based pixel-driving circuit' may simply be referred to as a pixel-driving circuit.

A pixel-driving circuit A-1 may distribute a signal input through a first column line 601 to the 2×2 display pixels 1-1, 1-2, 2-1, and 2-2 within the first macro pixel 620.

The pixel-driving circuit A-1 may distribute a signal input through a first row line 611 to the 2×2 display pixels 1-1, 1-2, 2-1, and 2-2 within the first macro pixel 620.

A pixel-driving circuit A-2 may perform the same operation as the pixel-driving circuit A-1. Accordingly, the pixel-driving circuit A-2 may distribute a signal input through a second column line 603 to display pixels 1-3, 1-4, 2-3, and 2-4 within a macro pixel.

In addition, the pixel-driving circuit A-2 may distribute a signal input through the first row line 611 to the display pixels 1-3, 1-4, 2-3, and 2-4 within the macro pixel.

A pixel-driving circuit B-1 may distribute a signal input through the first column line 601 to display pixels 3-1, 3-2, 4-1, and 4-2 within a macro pixel.

The pixel-driving circuit B-1 may distribute a signal input through a second row line 613 to the display pixels 3-1, 3-2, 4-1, and 4-2 within the macro pixel.

A pixel-driving circuit B-2 may distribute a signal input through the second column line 603 to display pixels 3-3, 3-4, 4-3, and 4-4 within a macro pixel.

The pixel-driving circuit B-2 may distribute a signal input through the second row line 613 to the display pixels 3-3, 3-4, 4-3, and 4-4 within the macro pixel.

A pixel-driving circuit A-3 may distribute a signal input through a third column line 605 to display pixels 1-5, 1-6, 2-5, and 2-6 within a macro pixel.

The pixel-driving circuit A-3 may distribute a signal input through the first row line 611 to the display pixels 1-5, 1-6, 2-5, and 2-6 within the macro pixel.

A pixel driver circuit B-3 may operate similarly to the pixel driver circuit A-3.

The common interface-based pixel-driving circuits A-1 to B-3 may include a common element that shares at least one of the column line of the column-driving circuit and the row line of the row-driving circuit for m×n display pixels within the macro pixel.

A specific example of a 'common element' is explained with reference to FIG. 7.

By applying the macro pixel and the common interface, the number of column lines may be reduced. In addition, the number of row lines may be reduced by applying the macro pixel and the common interface.

In addition, in the digital display device, each of a plurality of macro pixels may be grouped with each of the corresponding pixel-driving circuits to form a plurality of groups. The groups may be formed on a plurality of interposers that are electrically connected to a substrate through a plurality of bumps (solder balls).

For example, a material of the interposer may be any one of a film, a glass, and a silicon. When the digital display device is for a high-resolution display, a silicon interposer may be applied. When the digital display device is for a low-resolution display, a low-cost film interposer may be applied.

Specifically, the pixels 1-1, 1-2, 2-1, and 2-2 and the pixel-driving circuit A-1 may be grouped together and mounted on the same interposer, the pixels 1-3, 1-4, 2-3, and 2-4 and the pixel-driving circuit A-2 may be grouped together and mounted on the same interposer, the pixel 3-1, 3-2, 4-1, and 4-2 and the pixel-driving circuit B-1 may be grouped together and mounted on the same interposer, and the pixel 3-3, 3-4, 4-3, and 4-4 and the pixel-driving circuit B-2 may be grouped together and mounted on the same interposer.

In addition, the pixels 1-5, 1-6, 2-5 and 2-6 and the pixel-driving circuit A-3 may be grouped together and mounted on the same interposer, and the pixels 3-5, 3-6, 4-5 and 4-6 and the pixel-driving circuit B-3 may be grouped together and mounted on the same interposer.

Each of the pixel-driving circuits may be connected to one or more corresponding row lines 611 and 613 and one or more corresponding column lines 601, 603, and 605, and a signal input through at least one of the row and column lines may be distributed to m×n display pixels within a macro pixel grouped into the same group.

In addition, in the digital display device, a plurality of groups may be formed by grouping each of a plurality of macro pixels with each of the corresponding pixel-driving circuits, the pixel-driving circuit corresponding to each of the groups may be embedded in a substrate, and macro pixels corresponding to each of the groups may be formed on a substrate with an embedded pixel-driving circuit. An example of embedding a pixel-driving circuit in a substrate will be described in detail with reference to FIGS. 21 and 22I.

FIG. 6 illustrates a configuration in which one pixel-driving circuit is connected to one row line and one column line, but the present disclosure is not limited thereto. That is, when one pixel-driving circuit is connected to 2×2 display pixels, as shown in FIG. 6, two row lines and two column lines may be connected to the pixel-driving circuit.

Specifically, the pixel-driving circuit A-1 may distribute a signal input through the first row line 611 to the 2×2 display pixels 1-2, 1-2, 2-1, and 2-2 within the first macro pixel 620, and may distribute a signal input through the first column line 601 to the display pixels 1-1, 1-2, 2-1, and 2-2 within the first macro pixel 620.

The pixel-driving circuit A-2 may perform the same operation as the pixel-driving circuit A-1. Accordingly, the pixel-driving circuit A-2 ay distribute a signal input through the second column line 603 to the display pixels 1-3, 1-4, 2-3, and 2-4 within the macro pixel, and may distribute a signal input through the first row line 611 to the display pixels 1-3, 1-4, 2-3, and 2-4 within the macro pixel.

The pixel-driving circuit B-1 may distribute a signal input through the first column line 601 to the display pixels 3-1, 3-2, 4-1, and 4-2 within a macro pixel 620, and may distribute a signal input through the second row line 613 to the display pixels 3-1, 3-2, 4-1, and 4-2 within the macro pixel.

The pixel-driving circuit B-2 may distribute a signal input through the second column line 603 to the display pixels 3-3, 3-4, 4-3, and 4-4 within the macro pixel 620, and may distribute a signal input through the second row line 613 to the display pixels 3-3, 3-4, 4-3, and 4-4 within the macro pixel.

The pixel-driving circuit A-3 may distribute a signal input through the third column line 605 to display pixels 1-5, 1-6, 2-5 and 2-6 within a macro pixel 620, and may distribute a signal input through the first row line 611 to the display pixels 1-5, 1-6, 2-5 and 2-6 within the macro pixel 620.

A pixel-driving circuit B-3 may distribute a signal input through the third column line 605 to display pixels 3-5, 3-6, 4-5 and 4-6 within the macro pixel, and may distribute a signal input through the second row line 613 to the display pixels 3-5, 3-6, 4-5 and 4-6 within the macro pixel.

Each of the pixel-driving circuits A-1, A-2, . . . , and B-3 may include a common element that shares m×n display pixels within a macro pixel grouped into the same group and at least one line of a row line and a column line and m×n pixel individual elements for driving a plurality of light emitters included in each of the m×n display pixels within the macro pixel connected to the common element and grouped into the one set.

For example, each of the m×n pixel individual elements may include a pixel-embedded memory for storing video data input through the column signal distributor, and a pixel driver for controlling operation of the light emitters based on the video data and a timing signal input through the row signal distributor.

The number of row lines and column lines shared with m×n display pixels may be determined based on at least one of a fill factor and the application type of a pixel-driving circuit. Here, the fill factor may be determined based on the size design conditions of the pixel area of a display substrate and the sub-pixel area where a plurality of light emitters are disposed.

For example, the application type of the pixel-driving circuit may be divided into a large-area display, a monitor display, and a mobile display, and the fill factor may be determined to have a small value in the order of a large-area display, a monitor display, and a mobile display.

The pixel-driving circuits A-1, A-2, . . . , and B-3 may each further include at least one sensor disposed in a sensor area formed on the corresponding interposer.

In addition, each display pixel may be disposed on a pixel area formed on the corresponding interposer. Here, the pixel area may include sub-pixel areas where a plurality of light emitters is disposed and a non-active area excluding the sub-pixel areas.

In addition, a plurality of macro pixels each includes a pixel-driving circuit area where a pixel-driving circuit is disposed, and at least a portion of the pixel-driving circuit area may overlap a plurality of non-active areas.

The sub-pixel areas may be formed at the corners or outskirts of display pixels so that the sub-pixel areas are adjacent to each other.

The pixel-driving circuit according to one embodiment will be described in more detail with reference to FIGS. 7A to 7F.

The digital display device according to one embodiment will be described in more detail with reference to FIGS. 8 to 20.

FIGS. 7A to 7F are diagrams for illustrating a pixel-driving circuit according to one embodiment of the present disclosure.

Referring to FIGS. 7A to 7F, a pixel-driving circuit (MPD, micro pixel-driving IC) may be formed on an interposer that is electrically connected to a display substrate through a plurality of bumps.

For example, the material of the interposer may be any one of a film, a glass, and a silicon. In addition, the interposer may be formed based on a reel-to-reel process.

The bumps may include a column bump, a row bump, and a voltage bump.

More specifically, on the lower surface of the interposer, 8 bumps, i.e., a first column bump (Col 1), a second column bump (Col 2), a first row bump (Row 1), a second row bump (Row 2), a $V_{CC}$ voltage bump (VCC), a $V_{DD}$ voltage bump (VDD), a reference voltage bump (VREF), and a ground bump (GND), may be formed, but the present disclosure is not limited thereto and the configuration of the bumps may be easily changed depending on the design. For example, the interposer may have only one column bump and one row bump.

For example, the bumps may include at least one metal material selected from gold (Au) and copper (Cu), but the present disclosure is not limited thereto, and known metal materials constituting the bumps may be applied.

More specifically, the bumps may be at least one of a copper pillar bump with a pitch of 40 μm to 120 μm, a gold (Au) stud bump with a pitch of 20 μm to 60 μm, and a micro bump with a pitch of 5 μm to 40 μm.

For example, the bumps may further include magnetic nano powder. In this case, during an interposer formation process, the bumps may be controlled to be self-aligned and disposed in the correct position.

The pixel-driving circuit MPD may include a row terminal connected to a row bump connected to the row line of a row-driving circuit among a plurality of bumps and a column terminal connected to a column bump connected to the column line of a column-driving circuit among the bumps.

In addition, the pixel-driving circuit MPD may include a common element that shares at least one of the row terminal and the column terminal for L (L is a positive integer greater than or equal to 2) display pixels formed on the interposer and L pixel individual elements connected to the common element and driving a plurality of light emitters (R, G, B) included in each of the L display pixels.

For example, the pixel-driving circuit MPD may include a first column terminal, a second column terminal, a first row terminal, a second row terminal, a $V_{CC}$ voltage terminal, a $V_{DD}$ voltage terminal, a reference voltage terminal, and a ground terminal, which are each connected to 8 bumps through vias formed inside the interposer, but the present disclosure is not limited thereto.

In addition, the pixel-driving circuit MPD may further include a plurality of terminals connected to a plurality of light emitters (R, G, B) included in each display pixel.

The pixel-driving circuit MPD may further include at least one sensor disposed in a sensor area 710 formed on the interposer. For example, the sensor may be a touch sensor, but the present disclosure is not limited thereto.

The common element may include one of a power generator that generates the necessary power for the pixel-driving circuit, a column signal distributor that distributes a signal input through the column terminal to L pixel individual elements, and a row signal distributor that distributes a signal input through the row terminal to L pixel individual elements.

In addition, each of the L pixel individual elements may include a pixel-embedded memory that stores video data input through the column signal distributor.

In addition, sub-pixel areas where a plurality of light emitters of each of L display pixels is disposed may be formed at the corner or outside of a display pixel so that the sub-pixel areas are adjacent to each other.

The pixel-driving circuit MPD and the L pixel individual elements may be disposed on the same surface (top surface) of the interposer. Alternatively, the pixel-driving circuit MPD and the L pixel individual elements may be disposed on different surfaces of the interposer.

Figure 7A:
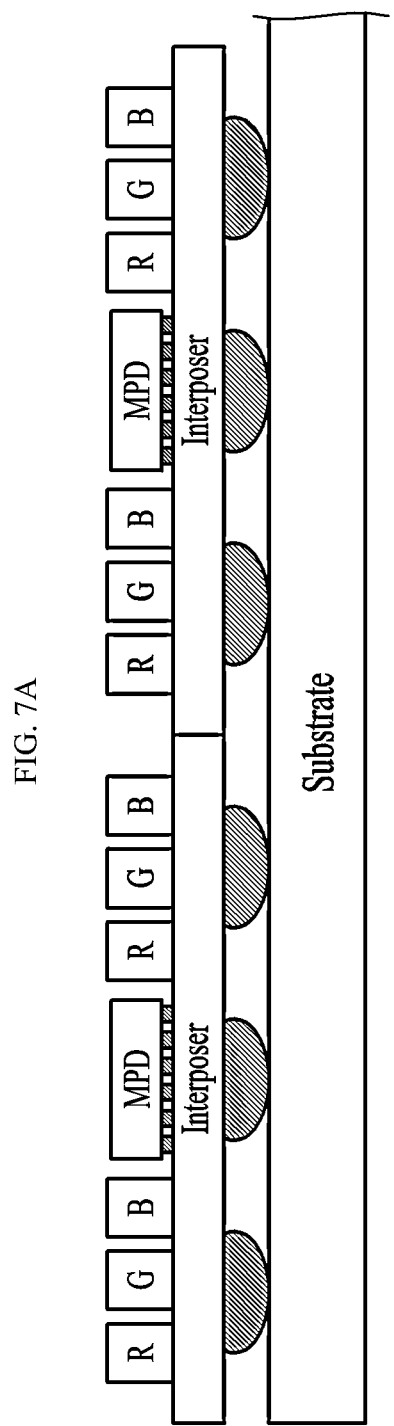
FIGS. 7A to 7F are diagrams for illustrating pixel-driving circuits according to embodiments of the present disclosure.
Figure 7B:
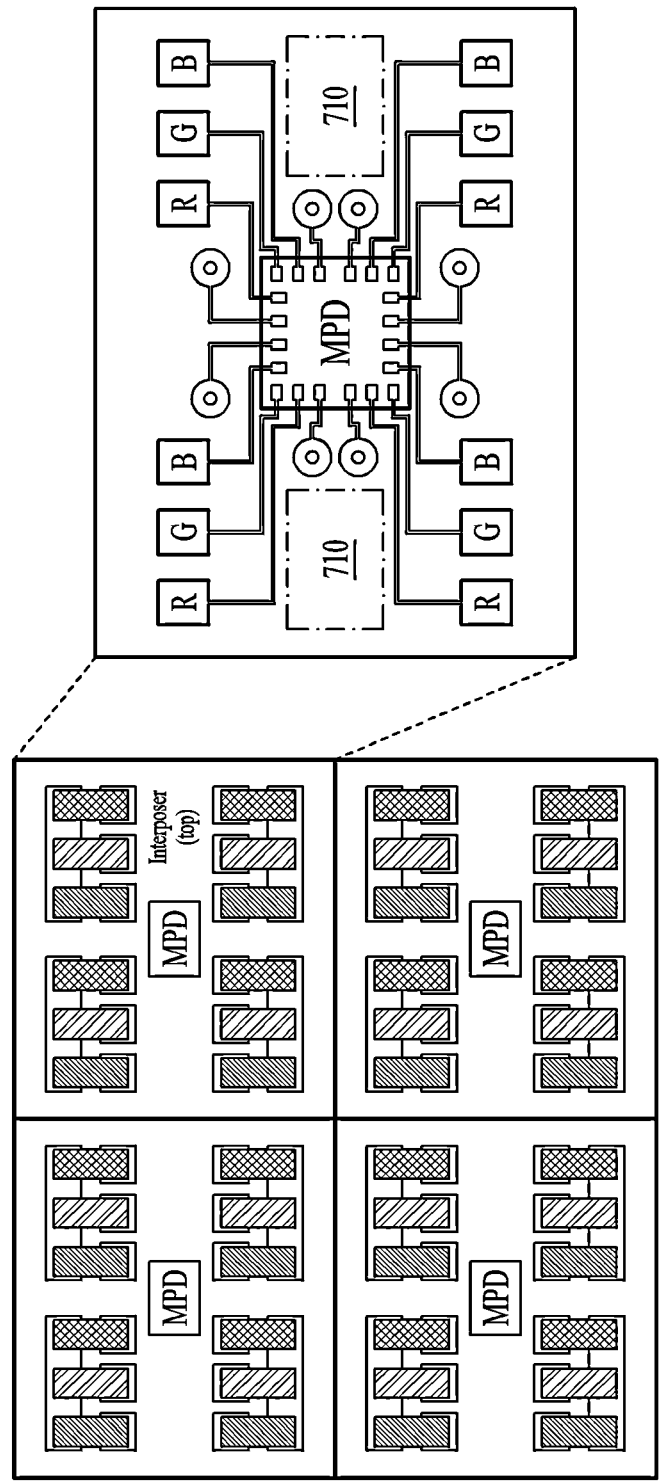
Figure 7C:
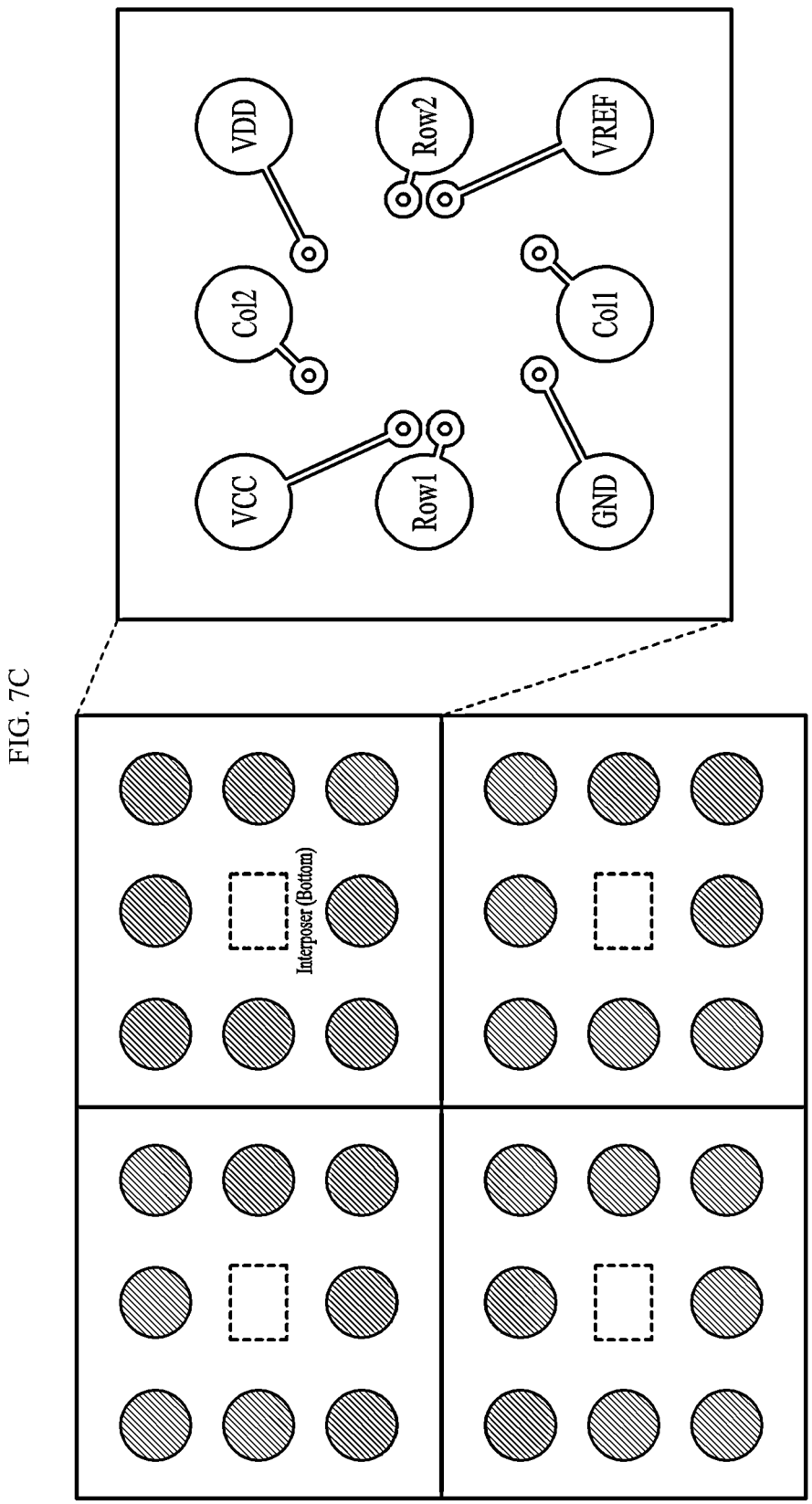
Figure 7D:
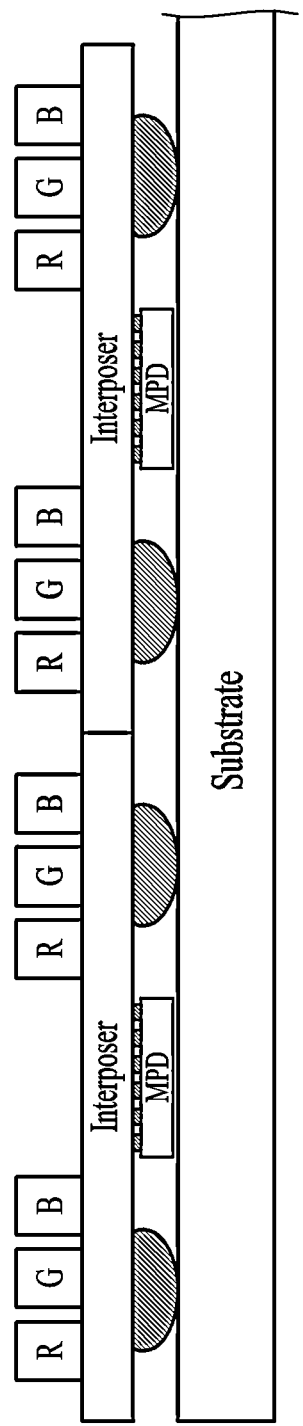

Specifically, the pixel-driving circuit MPD may be disposed on the lower surface (i.e., back) of the interposer, and the L pixel individual elements may be disposed on the upper surface of the interposer. This configuration may minimize element or chip damage due to static electricity (ESD) (FIG. 7D).

Figure 7E:
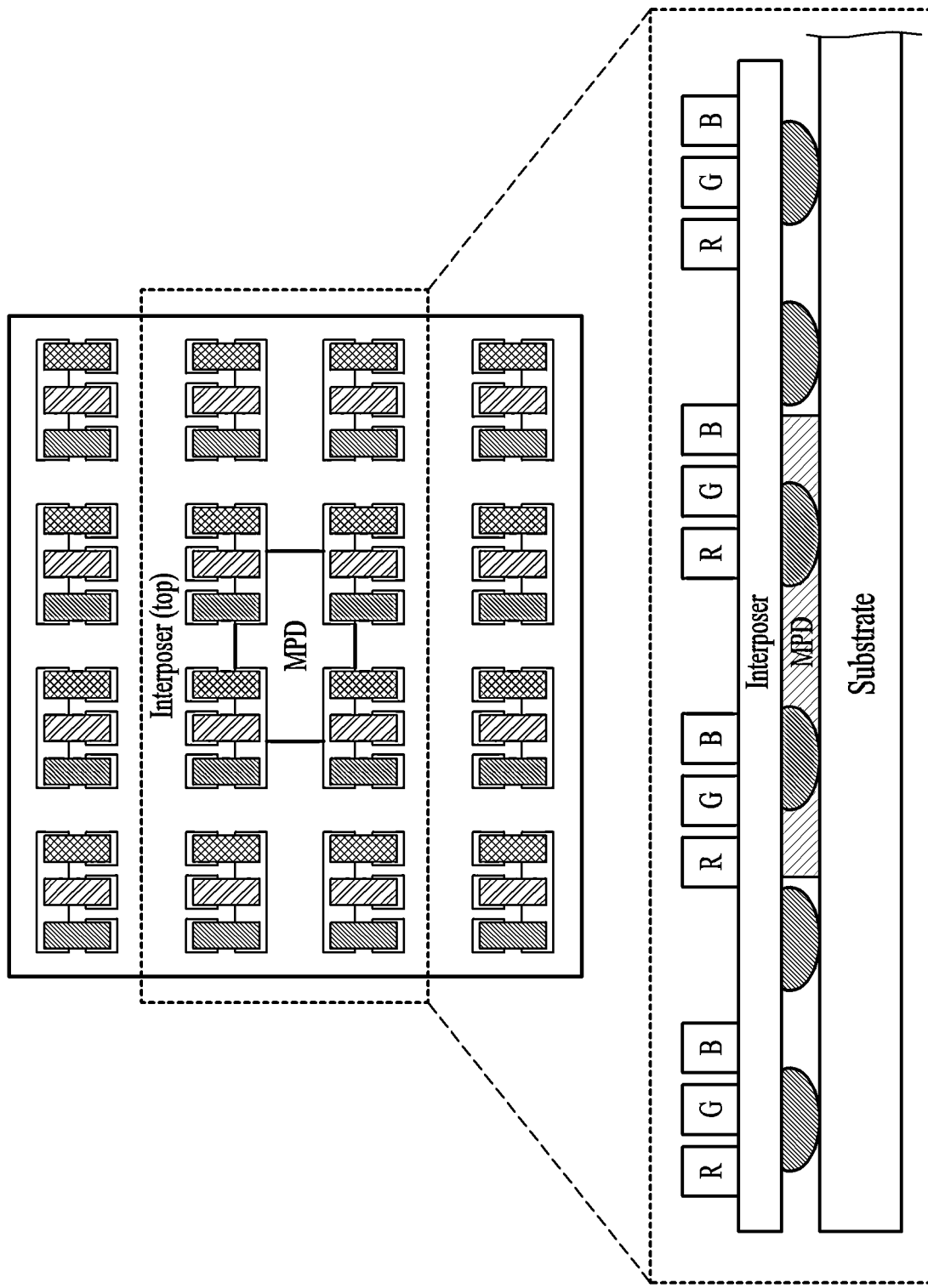
Figure 7F:
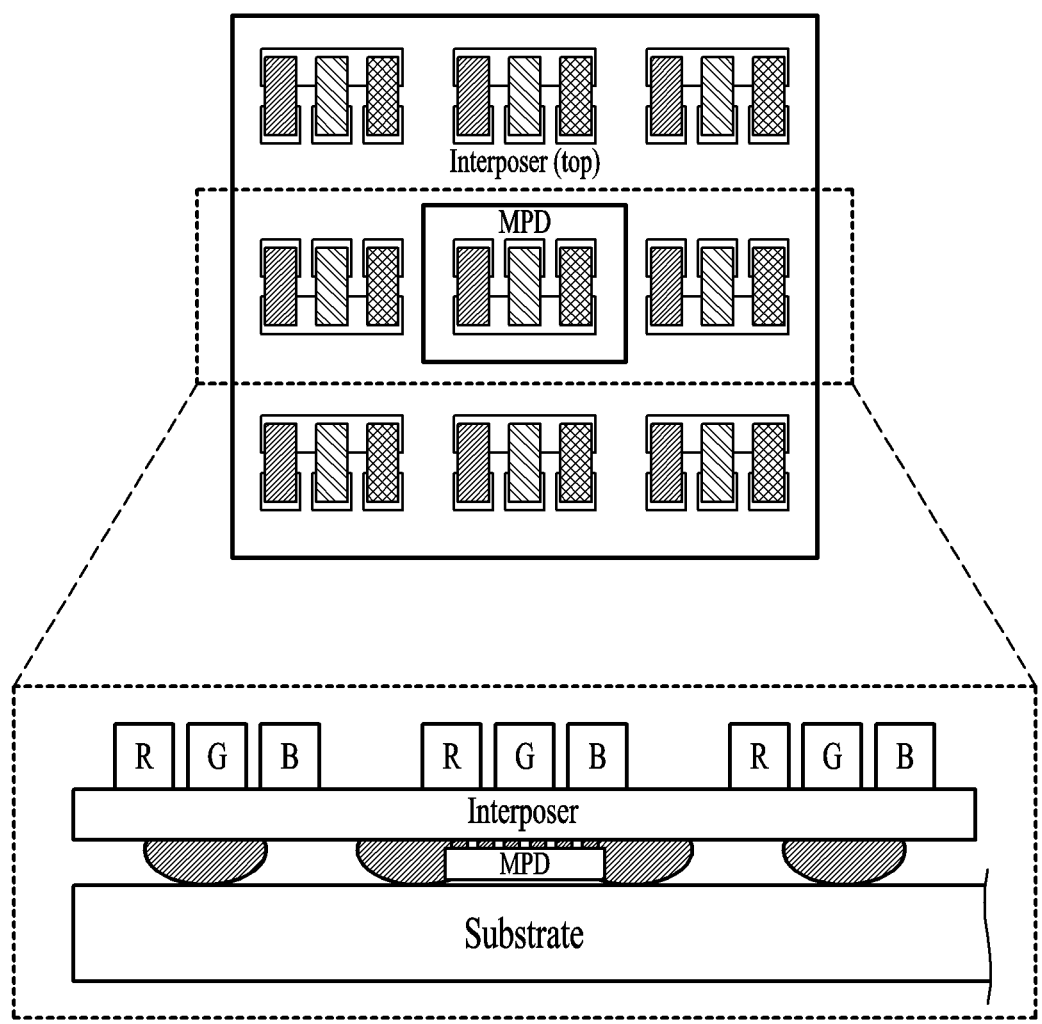

More specifically, when the pixel-driving circuit MPD is disposed on the lower surface of the interposer, even when the number (L) of pixel individual elements is more than 4 (e.g., 6, 8, 16, etc.), the pixel individual elements may be disposed on the upper surface of the interposer without space restrictions. In this case, space margin may be secured, and the L pixel individual elements may be arranged uniformly within a pixel cluster (FIGS. 7E and 7F).

Figure 8A:
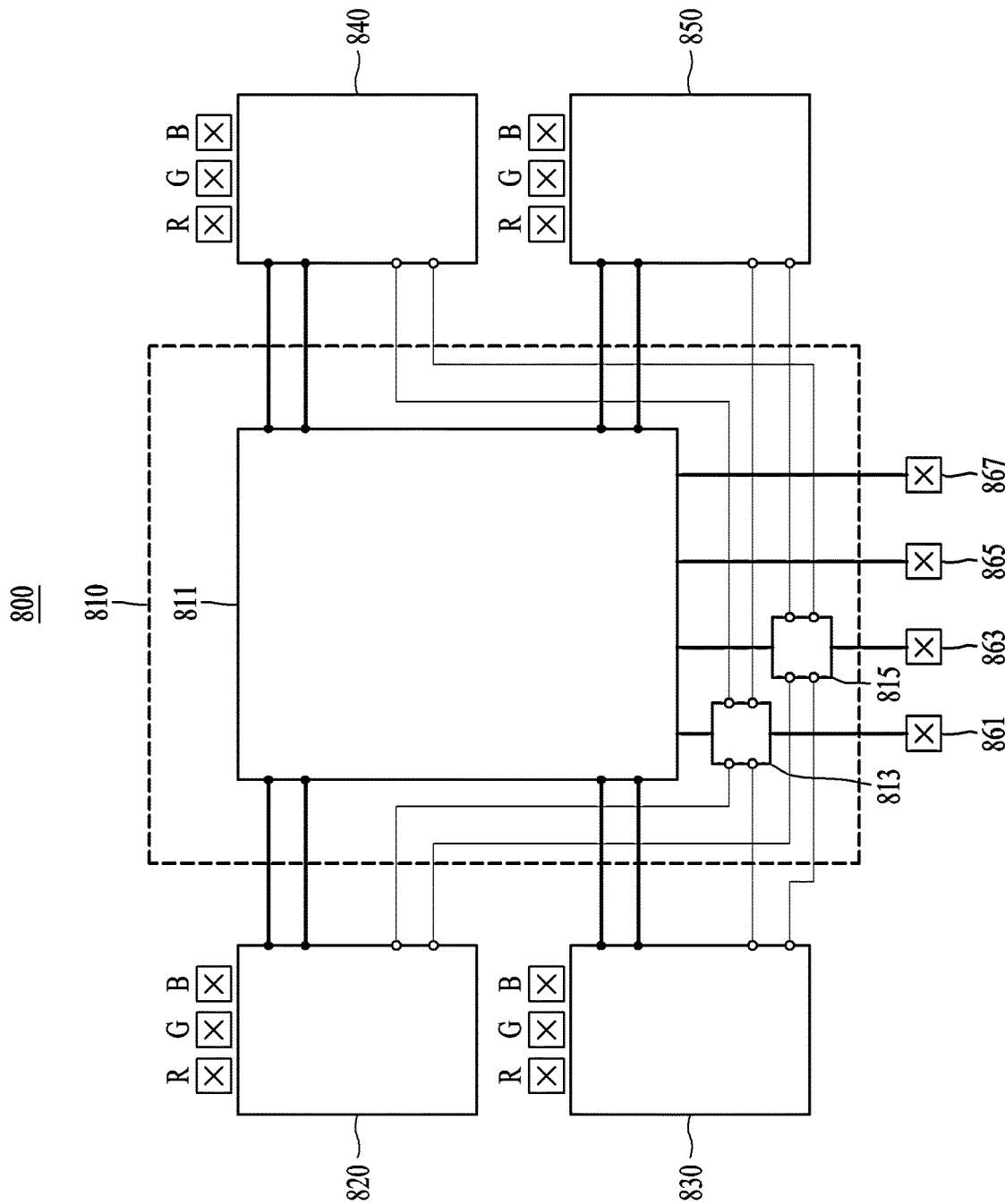
FIG. 8A is a diagram for illustrating an implementation example of a pixel-driving circuit according to one embodiment of the present disclosure.

FIG. 8A is a diagram for illustrating an implementation example of a pixel-driving circuit according to one embodiment of the present disclosure.

Referring to FIG. 8A, a pixel-driving circuit 800 includes a common element 810, a plurality of terminals 861, 863, 865 and 867, and pixel individual elements 820, 830, 840, and 850.

The common element 810 may share at least one of the column line of a column-driving circuit and the row line of a row-driving circuit for display pixels within a macro pixel.

Through the common element 810, the display pixels within the macro pixel may share at least one of the column line and the row line.

For example, the common element 810 may be a component of the pixel-driving circuit A-1 shown in FIG. 6. At this time, the common element 810 may share the first column line 601 and the first row line 611 for the display pixels 1-1, 1-2, 2-1, and 2-2 within the first macro pixel 620.

The common element 810 may be connected to the row line of the row-driving circuit through the row terminal 861 and may be connected to the column line of the column-driving circuit through the column terminal 863. In addition, power may be supplied through the VCC terminal 865 and the GND terminal 867.

Here, the expression 'sharing a column line for display pixels' may also be expressed as 'sharing a column terminal for display pixels'. Accordingly, the common element 810 may share at least one of the row terminal 861 and the column terminal 863 for display pixels within a macro pixel.

The common element 810 may include a power generator 811 that generates the necessary power for a pixel-driving circuit, a row signal distributor 861, and a column signal distributor 863. In addition, the common element 810 may further include a reset circuit.

The reset device may generate a reset signal that initializes a pixel-embedded memory included in each of the pixel individual elements 820, 830, 840, and 850. The reset device may initialize a pixel-embedded memory based on a row signal and a column signal in a preset video data reset section.

The power generator 811 may generate a reference voltage (VDD) using a row signal input from the row terminal 861 and a column signal input from the column terminal 863. The reference voltage may be output to each of the pixel individual elements 820, 830, 840, and 850.

In FIG. 8A, the two thick lines between the common element 810 and the pixel individual elements 820, 830, 840, and 850 represent electrical wiring that transmits a reference voltage and a reset signal.

Considering the manufacturing process of the electrical wiring between the common element 810 and the pixel individual elements 820, 830, 840, and 850, a transfer (or pick and place) process of a light-emitting element, cracks in a glass substrate that may be included in a display panel, bonding of TFT layers, and the like, an area where the pixel-driving circuit 800 is disposed may be determined as a specific location within a macro pixel. For example, the area where the pixel-driving circuit 800 is disposed, that is, the 'pixel-driving circuit area', may be formed to overlap a plurality of non-active areas within a macro pixel.

A column signal distributor 815 distributes a signal input through the column terminal 863 to the pixel individual elements 820, 830, 840, and 850.

The signal input through the column terminal 863 may be video data stored in the pixel-embedded memory of each of the pixel individual elements 820, 830, 840, and 850.

Here, the video data may be four digital data for display pixels corresponding to each of the pixel individual elements 820, 830, 840, and 850.

Accordingly, four digital data may be input at once through the column terminal 863, and the column signal distributor 815 may distribute four digital data to each of the pixel individual elements 820, 830, 840, and 850 based on addressing data or code commands included in the input signal.

A row signal distributor 813 distributes a signal input through the row terminal 861 to the pixel individual elements 820, 830, 840, and 850.

The signal input through the row terminal 861 may be a timing signal or a PWM driving signal for PWM driving of each of the pixel individual elements 820, 830, 840, and 850.

When the PWM driving signal input through the row terminal 861 is input at once, the row signal distributor 813 may distribute the PWM driving signal to each of the pixel individual elements 820, 830, 840, and 850 based on addressing data or code commands included in the input signal.

At this time, the row signal distributor 813 may distribute a timing signal for controlling the driving time of each display pixel within a macro pixel to each of the pixel individual elements 820, 830, 840, and 850.

In FIG. 8A, the two thin lines between the row signal distributor 813 and the pixel individual elements 820, 830, 840, and 850 represent electrical wiring for distribution of a row signal. In addition, the two thin lines between the column signal distributor 815 and the pixel individual elements 820, 830, 840, and 850 represent electrical wiring for distribution of a column signal.

The pixel individual elements 820, 830, 840, and 850 are each connected to the common element 810, and drive a plurality of light emitters included in each of display pixels within a macro pixel.

The pixel individual elements 820, 830, 840, and 850 may each include a pixel-embedded memory that stores video data input through the column signal distributor 815.

The pixel individual elements 820, 830, 840, and 850 may each include a pixel driver that controls the operation of a plurality of light emitters based on video data and a PWM driving signal.

The pixel individual elements 820, 830, 840, and 850 may each include a plurality of terminals or electrodes connected to light-emitting elements. For example, the pixel individual elements 820, 830, 840, and 850 may each include R, G, and B electrodes connected to light-emitting elements.

In FIG. 8A, reference numerals 865 and 867 indicate a voltage input terminal and a ground terminal that may be additionally provided in the pixel-driving circuit.

FIG. 8A shows an example of distributing signals input through the row terminal 861 and the column terminal 863 to the pixel individual elements 820, 830, 840, and 850. Signals input through the row terminal 861 and the column terminal 863 may be processed differently from the example shown in FIG. 8A. Other processing examples above will be explained with reference to FIG. 25.

In addition, a common interface for driving display pixels within a macro pixel may be designed considering a fill factor. In addition, a common interface may be designed considering the application type of a pixel-driving circuit.

Accordingly, the number of column terminals and row terminals shared for a macro pixel may be determined based on at least one of the application types of a fill factor and pixel-driving circuit.

The application types of the pixel-driving circuit may be divided into a large-area display, a monitor display, and a mobile display.

At this time, the fill factor may be determined to have a small value in the order of a large-area display, a monitor display, and a mobile display.

For example, a display for television or a large display for outdoor installation may be a large-area display. At this time, the large-area display may be designed with a fill factor of 10 to 30% (0.1 to 0.3).

For example, a display for computer monitors, a vehicle display, or a display for pad devices may be a monitor display. At this time, the monitor display may be designed with a fill factor of 30 to 50% (0.3 to 0.5).

For example, displays for mobile smartphones and wearable devices may be mobile displays. At this time, the mobile display may be designed with a fill factor of 50 to 90% (0.5 to 0.9).

Figure 8B:
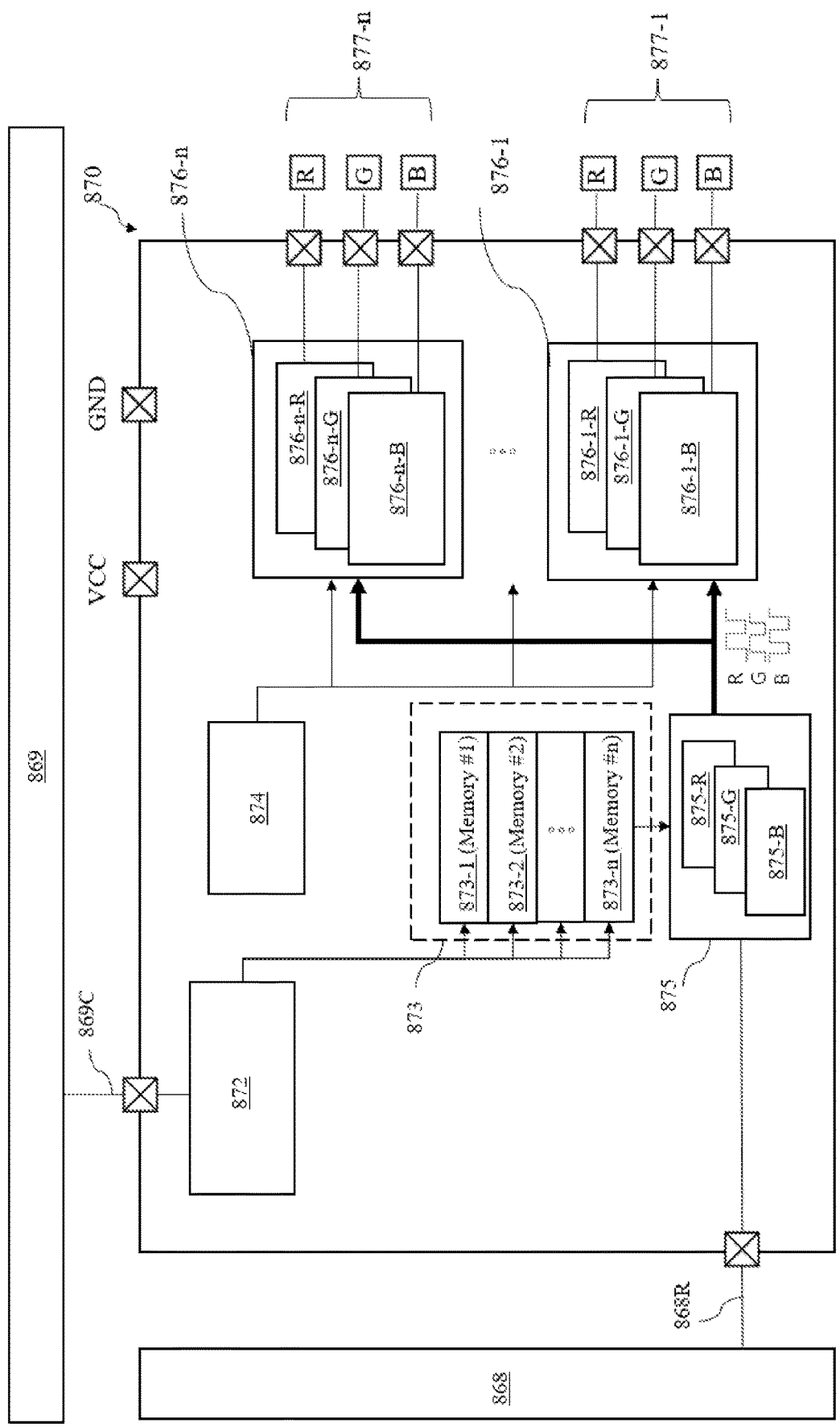
FIG. 8B is a diagram for illustrating an implementation example of a pixel-driving circuit according to one embodiment of the present disclosure.

FIG. 8B illustrates another example of the pixel-driving circuit (or the pixel cluster drive circuit) according to one embodiment of the present disclosure.

Macro pixel (or a pixel cluster) includes a cluster of n (an integer of two or more) pixels and pixel cluster driver 870 to drive the n pixels 877-1 to 877-n. Each pixel includes a set of luminous elements that express a variety of colors. For example, each pixel may include red (R), green (G), and blue (B) light emitting diodes (LEDs). Various combinations of the LED sets with other different colors are also possible.

As shown in FIG. 8B, pixel cluster driver 870 includes signal generator 872, bias circuit 874, internal memory 873, PWM controller 875, and pixel drive circuits 876-1 to 876-n. Each of pixel cluster drive circuits 876-1 to 876-n are connected to respective pixels 877-1 to 877-n. PWM controller 875 can be replaced with a PAM controller.

Signal generator 872 is connected to column driver 869 via column line 869C and sequentially receives the gradation data for each R/G/B diode of n pixels 877-1 to 877-n from column driver 869. Then, signal generator 872 outputs respective individual gradation data for each R/G/B of the n pixels 877-1 to 877-n to the internal memory 873.

In addition, the signal generator 872 may include a reset circuit that outputs a reset signal to the internal memory 873 to reset the data stored in the internal memory based on the signals of row line 868R and column line 869C. In one embodiment, the reset circuit may contain one or more D Flip-Flops. Signal generator 872 may be implemented as a processor such as a CPU or a programable logic device.

Internal memory 873 may be a combination of a plurality of individual memories or may be made up of a single memory comprising multiple memory blocks. In this embodiment, internal memory 873 includes memory blocks 873-1 to 873-n, each of which stores respective gradation data for each pixel. In other words, each pixel is allocated one memory block (or one individual memory) independently. The memory 503 may be implemented as a random access memory (RAM), for example, SRAM or DRAM.

PWM controller 875 is connected to row line 871R and receives clock signals for each subframe from row driver 868. Then, PWM controller 875 generates PWM driving signals for the R/G/B drivers (876-1-R/G/B to 876-n-R/G/B) of each of n pixels based on the individual gradation data stored in memory 873. The PWM controller 875 supplies the PWM driving signals for the R/G/B drivers of each of individual pixel drive circuits 876-1 to 876-n. Each R/G/B driver includes a switching transistor that turns on/off the R, G, B LEDs of each pixel according to the PWM driving signals. PWM controller 875 (or a PAM controller) may be implemented as a processor such as a CPU or a programable logic device.

Bias circuit 874 receives a reference voltage from the VCC terminal, and generates a bias voltage Vbias and supplies the bias voltages to the R/G/B drivers of pixel drive circuits 876-1 to 876-n.

In this embodiment, the pixel cluster driving circuit 870 can include a common element that commonly drives the n pixels, and individual elements that individually drive the n pixels. The common element may include signal generator 872, bias circuit 874, and PWM controller 874, and the individual elements may include pixel drive circuits 876-1 to 876-*n*. Internal memory 873 is divided into multiple memory blocks allotted independently to each pixel, but it may physically be composed of a single memory.

By implementing the signal generator 872 and the bias circuit 875 as the common element, the overall size of the pixel cluster drive circuit 870 can be reduced, and also substantially the same voltage is uniformly supplied to each of the pixels in the pixel cluster, so the illuminance performance between the pixels can be minimized.

Figure 8C:
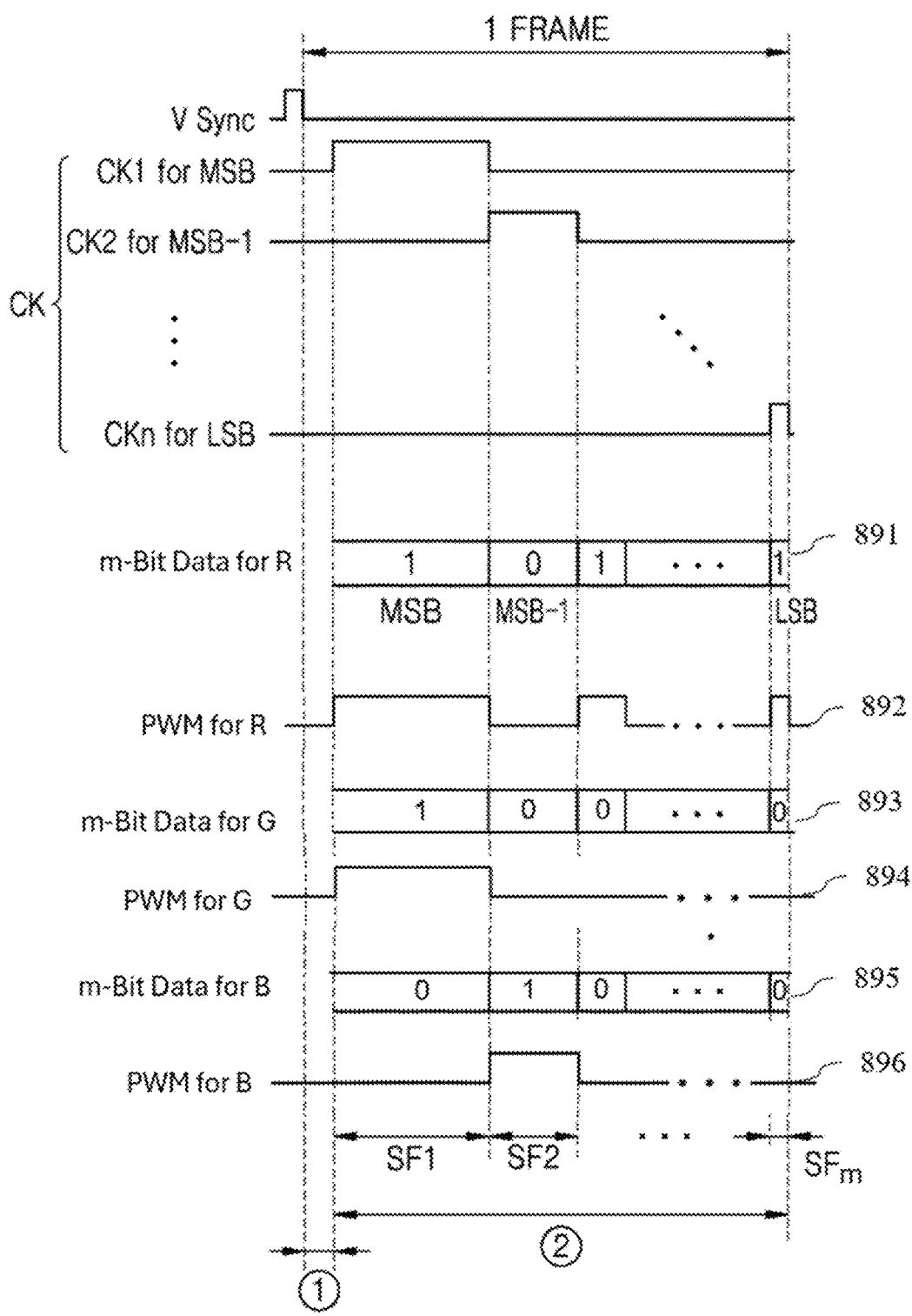
FIG. 8C illustrates another example of the pixel-driving circuit (or the pixel cluster drive circuit) according to one embodiment of the present disclosure.

FIG. 8C illustrates another example of the pixel-driving circuit (or the pixel cluster drive circuit) according to one embodiment of the present disclosure.

Individual gradation data for the R/G/B drivers include m-bit data. One frame may include a plurality of subframes, and the n-th subframe corresponds to the n-th graduation data. The lengths of subframes may be different from one another. For example, the length of a subframe corresponding to the most significant bit MSB of image data may be set to be the longest, and the length of a subframe corresponding to the least significant bit LSB may be set to be the shortest.

FIG. 8C is a diagram for explaining how to generate the PWM signals for driving the R/G/B diodes of one of the n pixels according to an embodiment of the present disclosure.

Each pixel may be driven in a unit of a frame. A single frame includes the data-writing period ① and the light-emitting period ② The light-emitting period ② may be divided into a first subframe SF1 to an m-th subframe SFm.

During the data-writing period ①, signal generator 872 receives the gradation data for the R/G/B diodes of one of n pixels 877-1 to 877-*n* from column driver 869. Then, the gradation data are moved into the internal memory 873 and are stored therein. Internal memory 873 may be divided into n memory blocks, in which the i-th memory block stores three m-bit gradation data for driving the R/G/B diodes of pixel 877-*i*., wherein i is an integer less than or equal to n.

During the light-emitting period ②, clock signal CKs are applied to the PWM controller 874. PWM controller 874 may generate three PWM signals for R/G/B diodes of each pixel based on the clock signals and the m-bit gradation data recorded in internal memory 873. Three PWM signals per pixel are fed to pixel drive circuits 876-1 to 876-*n* for driving the R/G/B diodes of n pixels 877-1 to 877-*n*. As an example, m-bit data 891 for the red light emitting diode includes the bit value of 101 . . . 1. PWM controller 875 outputs a high pulse for each subframe when the bit value is '1,' and a low pulse when the bit value is '0'. As a result, the PWM signal for R 892 for driving the red light emitting diode during the one frame is generated as shown in FIG. 8C. Similarly, m-bit data 893 for the green light emitting diode includes the bit value of 100 . . . 0, which results in the PWM signal for G 894; and m-bit data 895 for the blue diode includes the bit value of 010 . . . 0, which results in the PWM signal for B 896.

Hereinafter, various examples of common interface design for macro pixel operation will be described with reference to FIGS. 9 to 11.

Figure 9:
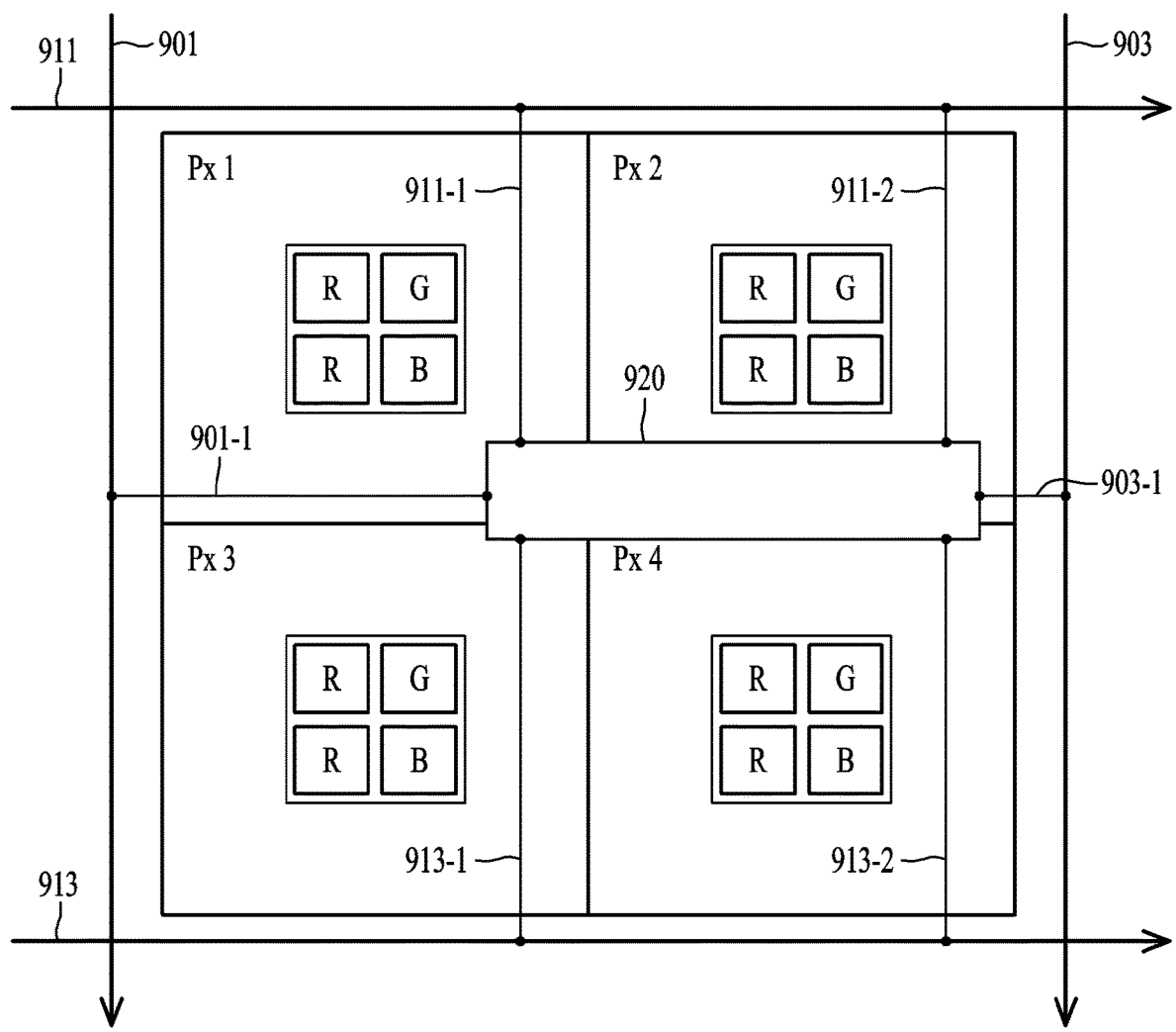
FIG. 9 is a diagram for illustrating a macro pixel circuit and its operation according to one embodiment of the present disclosure.

FIG. 9 is a diagram for illustrating macro pixel operation according to one embodiment of the present disclosure.

The embodiment shown in FIG. 9 may be applied to large-area displays.

Referring to FIG. 9, a macro pixel consists of four display pixels Px1, Px2, Px3, and Px4.

At this time, pixel-driving circuits 920*a* and 920*b* may include a first common element disposed in the pixel-driving circuit 920*a* and a second common element disposed in the pixel-driving circuit 920*b*. The pixel-driving circuits 920*a* and 920*b* may each include two pixel individual elements.

The pixels Px1 and Px3 may share a column line 901 through the electrical wiring 901-1. The pixels Px2 and Px4 may share a column line 903 through electrical wiring 903-1.

Accordingly, the pixel-driving circuits 920*a* and 920*b* may each be equipped with a distributor to distribute column line signals.

FIG. 9 illustrates a structure in which macro pixels do not share a row line. In the case of large-area displays, it may be desirable not to share a row line in consideration of efficient PWM operation and power distribution.

Accordingly, the pixel-driving circuits 920*a* and 920*b* may not each be equipped with a distributor for distributing a row line signal.

The pixel-driving circuit 920*a* may receive a row signal input from a row line 911 through electrical wiring 911-1. At this time, the row signal input through the electrical wiring 911-1 is a signal for driving the Px1.

The pixel-driving circuit 920*b* may receive a row signal input from the row line 911 through electrical wiring 911-2. At this time, the row signal input through the electrical wiring 911-2 is a signal for driving the Px2.

The pixel-driving circuit 920*a* may receive a row signal input from a row line 913 through electrical wiring 913-1. At this time, the row signal input through the electrical wiring 913-1 is a signal for driving the Px3.

The pixel-driving circuit 920*b* may receive a row signal input from the row line 913 through electrical wiring 913-2. At this time, the row signal input through the electrical wiring 913-2 is a signal for driving the Px4.

Figure 10:
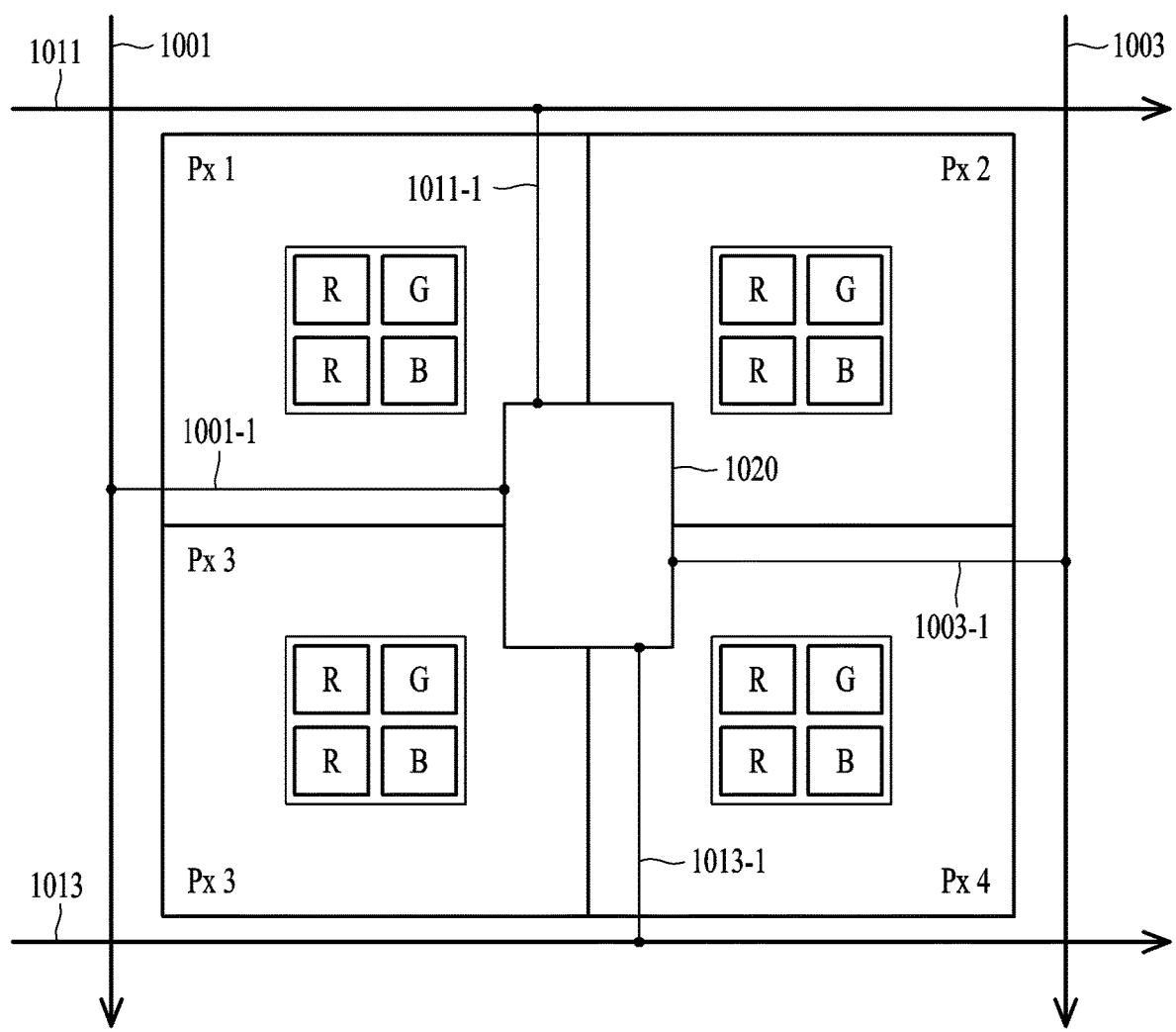
FIG. 10 is a diagram for illustrating a macro pixel circuit and its operation according to another embodiment of the present disclosure.

FIG. 10 is a diagram for illustrating macro pixel operation according to another embodiment of the present disclosure.

The example shown in FIG. 10 may be applied to large-area displays or monitor displays.

Referring to FIG. 10, the macro pixel consists of four display pixels Px1, Px2, Px3, and Px4.

A pixel-driving circuit 1020 may include one common element or two common elements. The pixel-driving circuit 1020 may include four pixel individual elements.

The pixels Px1 and Px3 may share a column line 1001 through electrical wiring 1001-1. The pixels Px2 and Px4 may share a column line 1003 through electrical wiring 1003-1.

The pixel-driving circuit 1020 may be equipped with a distributor for distributing column line signals.

Unlike the example in FIG. 9, in the example shown in FIG. 10, a row line may be shared.

The pixel-driving circuit 1020 may receive a row signal input from a row line 1011 through electrical wiring 1011-1. At this time, the row signal input through the electrical wiring 1011-1 may be a signal for driving the Px1 and the Px2. Alternatively, the row signal input through the electrical wiring 1011-1 may be a signal for driving the Px1 and the Px3.

The pixel-driving circuit 1020 may receive a row signal input from a row line 1013 through electrical wiring 1013-1. At this time, the row signal input through the electrical wiring 1013-1 may be a signal for driving the Px3 and the Px4. Alternatively, the row signal input through the electrical wiring 1013-1 may be a signal for driving the Px2 and the Px4.

Figure 11:
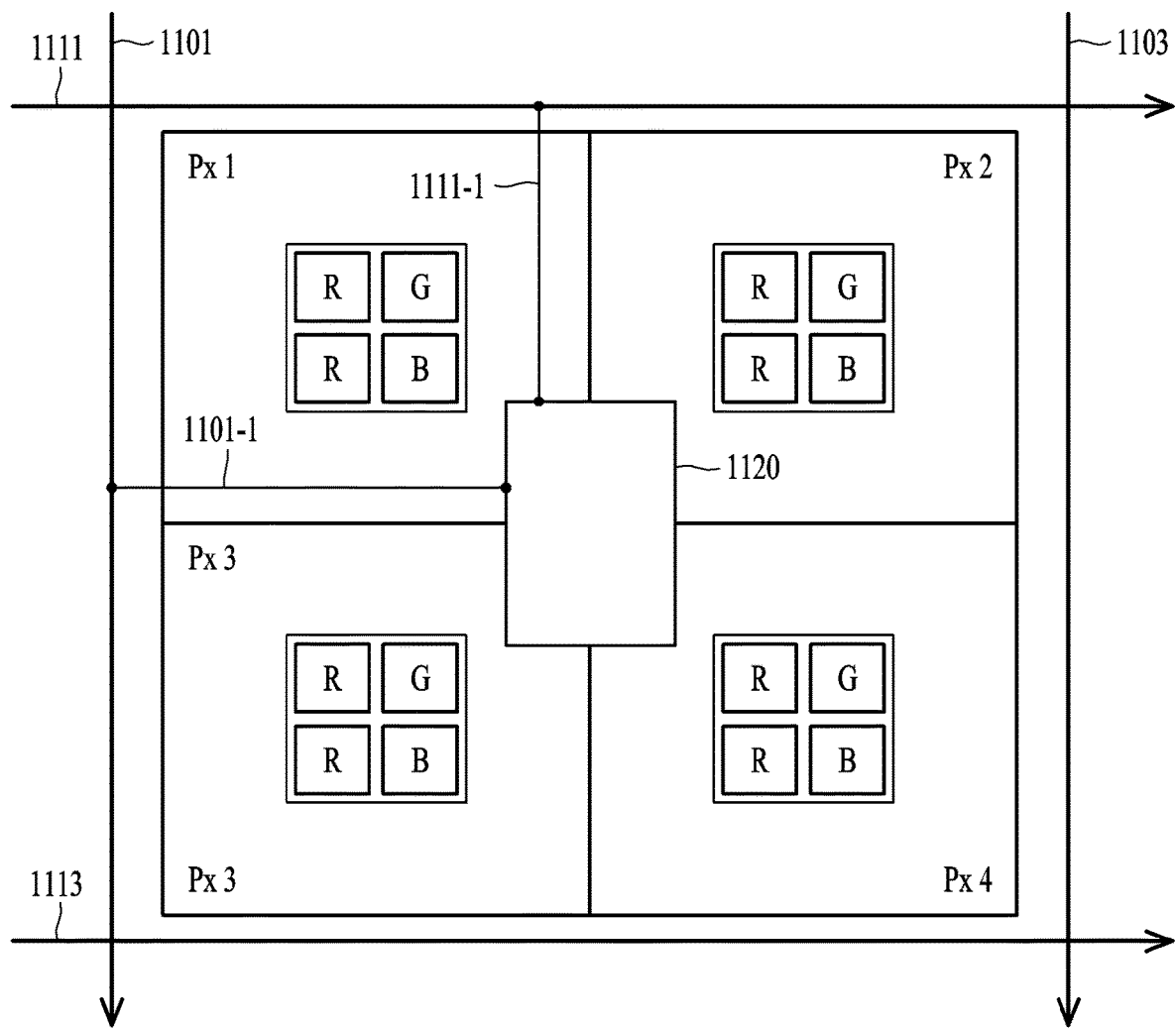
FIG. 11 is a diagram for illustrating macro pixel circuit and its operation according to another embodiment of the present disclosure.

FIG. 11 is a diagram for illustrating macro pixel operation according to another embodiment of the present disclosure.

The example shown in FIG. 11 may be applied to large-area displays or mobile displays.

Referring to FIG. 11, a macro pixel consists of four display pixels Px1, Px2, Px3, and Px4.

A pixel-driving circuit 1120 may include one common element and four individual elements.

The pixels Px1, Px2, Px3, and Px4 may share a column line 1101 through electrical wiring 1101-1.

The pixel-driving circuit 1120 may be equipped with a distributor for distributing column line signals.

The pixels Px1, Px2, Px3, and Px4 may share a row line 1111 through electrical wiring 1111-1.

The pixel-driving circuit 1120 may be equipped with a distributor for distributing row line signals.

In FIG. 11, a column line 1103 may supply a column signal to the next macro pixel. In addition, a row line 1113 may supply a row signal to other macro pixels.

Figure 12:
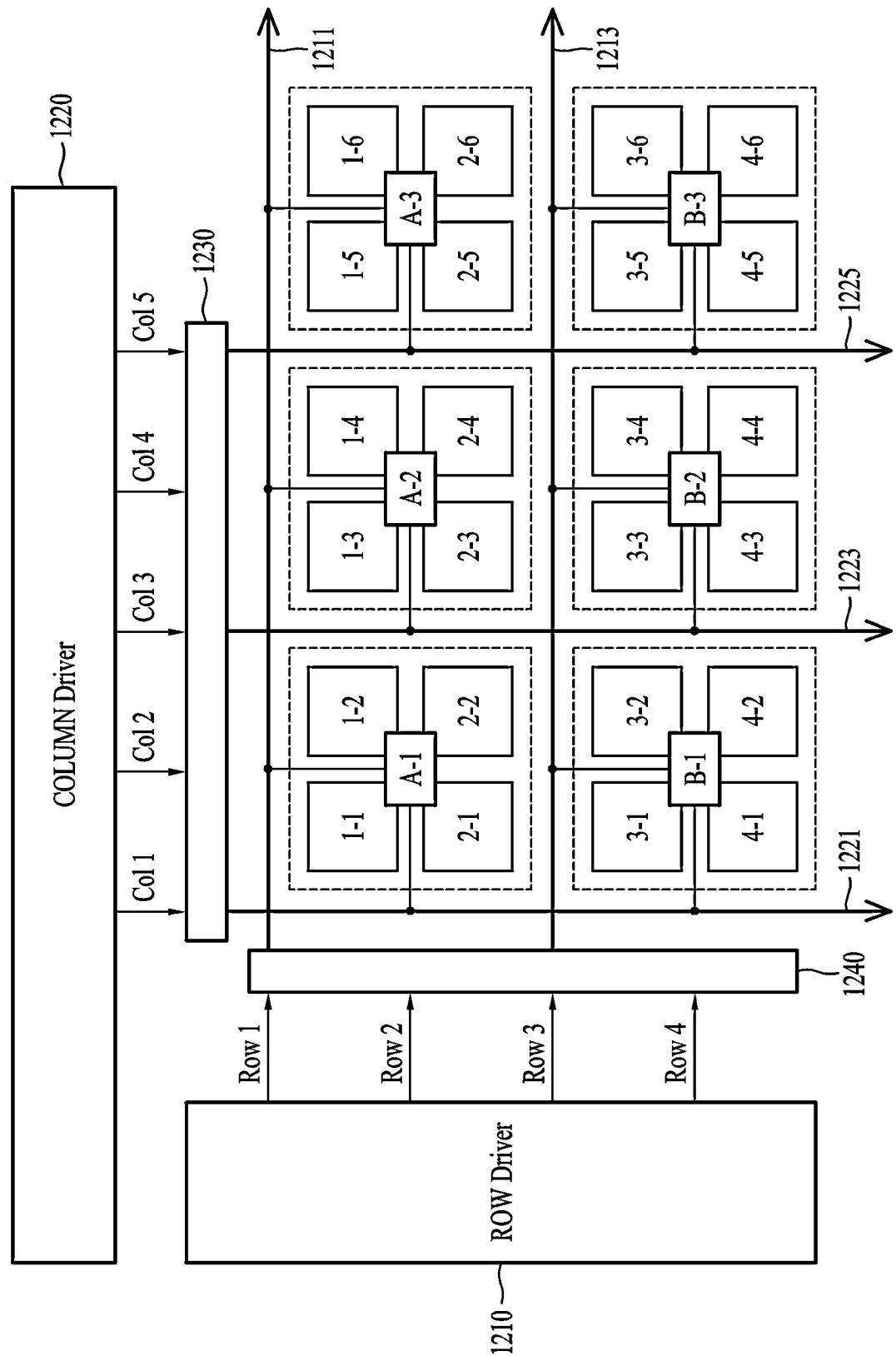
FIG. 12 is a diagram for illustrating a display-driving circuit according to one embodiment of the present disclosure.

FIG. 12 is a diagram for illustrating a display-driving circuit according to one embodiment of the present disclosure.

The macro pixel and common interface applied to FIG. 12 may include examples described through FIGS. 6 to 10.

Unlike the display-driving circuit according to the prior art shown in FIG. 5, in the display-driving circuit according to one embodiment of the present disclosure, the number of column lines and row lines on a display panel may be reduced.

Here, the number of column lines 1221, 1223, and 1225 and row lines 1211 and 1213 on the display panel may be determined based on Equation 1 below.

[Equation 1]

$$ROW_N = M/m + RR, \quad RR = MOD(M, m)$$

$$Col_N = N/n + R_C, \quad R_C = MOD(N, n)$$

Here, $Row_N$ means the number of row lines, $Col_N$ means the number of column lines, and MOD (X, Y) means the remaining value of X/Y.

Referring to FIG. 12, M is 4, and m is 2. Accordingly, MOD (M, m) is 0, and the number of total row lines is 3.

Referring to FIG. 12, N is 5, and n is 2. Accordingly, MOD (M, n) is 1, and the number of total column lines is 3.

In FIG. 12, addressing data or code commands for distributing column signals to pixel individual elements may be generated in a column driver 1220. In addition, addressing data or code commands may be generated in a separate column addressing unit 1230.

To perform the same operation as video data input according to the prior art, the column addressing unit 1230 may input video data to the pixel-driving circuits A-1 and B-1 through serial-to-parallel conversion or combination of column signals input from Col1 and Col2.

For example, the signal output from Col1 may be a bit stream of video data input to the pixels 1-1, 2-1, 3-1, and 4-1. The signal output from Col2 may be a bit stream of video data input to the pixels 1-2, 2-2, 3-2, and 4-2.

The column addressing unit 1230 may combine column signals input from Col1 and Col2 and may convert the column signals into sequences corresponding to the pixels 1-1, 2-1, 1-2, 2-2, 3-1, 4-1, 3-2, and 4-2.

At this time, the sequences corresponding to the pixels 1-1, 2-1, 1-2, and 2-2 may be input into the pixel-driving circuit A-1. The sequences corresponding to the pixels 3-1, 4-1, 3-2, and 4-2 may be input into the pixel-driving circuit B-1.

In FIG. 12, addressing data or code commands for distributing row signals to pixel individual elements may be generated in a row driver 1210. In addition, addressing data or code commands may be generated in a separate row addressing unit 1240.

For example, the signal output from ROW1 may be a timing signal input to the pixels 1-1, 1-2, 1-3, 1-4, and 1-5. The signal output from ROW2 may be a timing signal input to the pixels 2-1, 2-2, 2-3, 2-4, and 2-5.

The row addressing unit 1240 may combine column signals input from ROW1 and ROW2 and may convert the column signals into sequences corresponding to the pixels 1-1, 1-2, 2-1, 2-2, 1-3, 1-4, 2-3, 2-4, 1-5, and 2-5. At this time, the sequences corresponding to the pixels 1-1, 1-2, 2-1, and 2-2 may be input into the pixel-driving circuit A-1. The sequences corresponding to the pixels 1-3, 1-4, 2-3, and 2-4 may be input into the pixel-driving circuit B-1. The sequences corresponding to the pixels 1-5 and 2-5 may be input into the pixel-driving circuit A-3.

By reducing the column lines and row lines formed on the display panel, the thickness of electrical wiring may be further increased. For example, when the thickness of the wire formed on the display panel is increased, IR-Drop (voltage drop) may be reduced.

By reducing the lines formed on the display panel, advantages such as simplification of electrical wiring, improved assembly, reduced manufacturing cost, and reduced complexity may be achieved.

Figure 13:
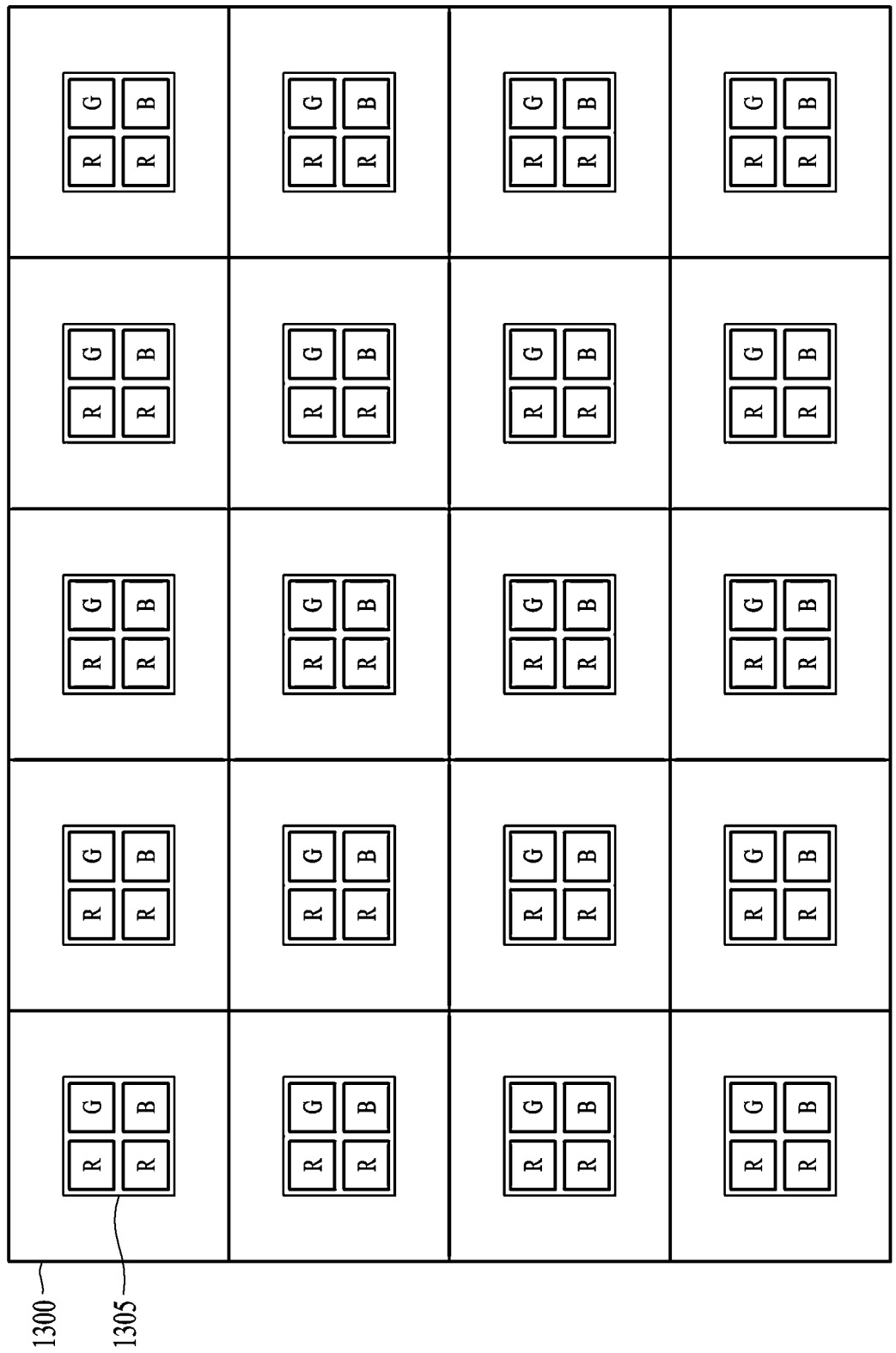
FIG. 13 is a diagram for illustrating an example of a display array configuration according to the prior art.

FIG. 13 is a diagram for illustrating an example of a display array configuration according to the prior art.

The introduction of the macro pixel and the common interface may be said to be an improvement in the characteristics of the display system from the perspective of the display-driving circuit. The macro pixel and the common interface may also be applied to the display array configuration according to the prior art. FIGS. 9 to 11 show examples of applying the macro pixel and the common interface to the display array configuration according to the conventional art.

In addition, in the case of a micro-LED applied display in which a plurality of light-emitting elements 1305 is disposed on a display pixel 1300, characteristics improvement considering the transfer (pick and place) process may be required.

When the chip size is less than 10 μm, the transfer process may be difficult.

Figure 14A:
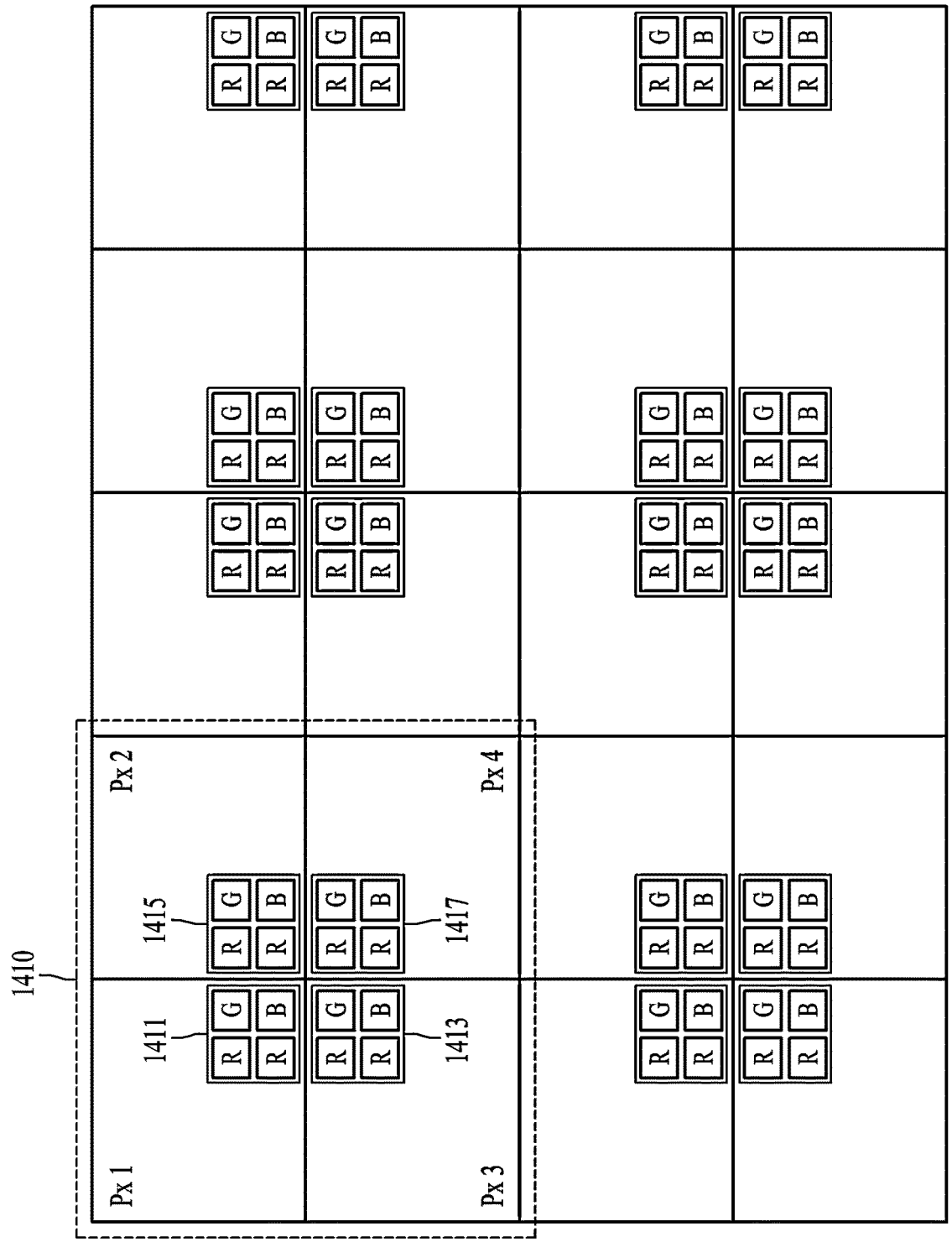
FIGS. 14A and 14B are diagrams for illustrating examples of a display array configuration according to an embodiment of the present disclosure.
Figure 14B:
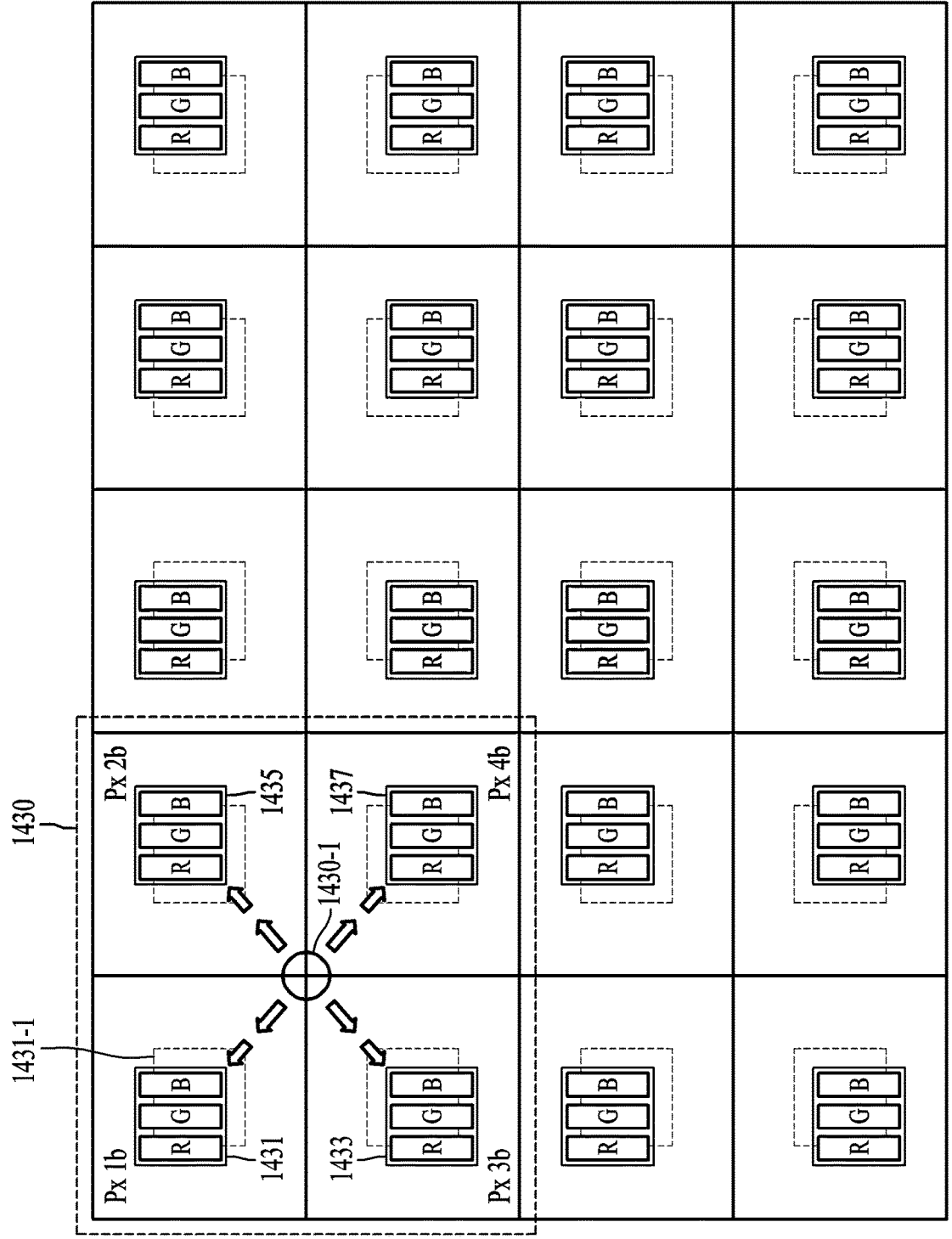

FIGS. 14A and 14B are diagrams for illustrating examples of a display array configuration according to an embodiment of the present disclosure.

Referring to FIG. 14A, m×n display pixels Px1, Px2, Px3, and Px4 within a macro pixel 1410 include sub-pixel areas 1411, 1413, 1415, and 1417 where a plurality of light emitters is disposed.

The sub-pixel areas 1411, 1413, 1415, and 1417 of each of the m×n display pixels Px1, Px2, Px3, and Px4 may be formed at the corner or outside of the display pixel so that the sub-pixel areas are adjacent to each other.

That is, the sub-pixel areas 1411, 1413, 1415, and 1417 may be arranged at the corner or outside of the display pixel, and the adjacent pixels 1411, 1413, 1415, and 1417 may be transferred at once.

At least one macro pixel 1410 of a plurality of macro pixels on the display array may consists of the first display pixel Px1, the second display pixel Px2 located on the right side of the first display pixel Px1, the third display pixel Px3 located below the first display pixel Px1, and the fourth display pixel Px4 located on the right side of the third display pixel Px3.

At least a portion of the sub-pixel area 1411 of the first display pixel Px1 may be formed on (transferred to) the lower right corner of the first display pixel Px1.

At least a portion of the sub-pixel area 1415 of the second display pixel Px2 may be formed on (transferred to) the lower left corner of the second display pixel Px2.

At least a portion of the sub-pixel area 1413 of the third display pixel Px3 may be formed on the upper right corner of the third display pixel Px3.

At least a portion of the sub-pixel area 1417 of the fourth display pixel Px4 may be formed on the upper left corner of the fourth display pixel Px4.

In addition, a macro pixel 1430 may consist of two display pixels. At this time, sub-pixel areas 1431 and 1433 may be formed at the corner or outside of the display pixel so that the sub-pixel areas are adjacent to each other.

The display pixel array structure shown in FIG. 14A may have the same physical dimensions and fill factor as the structure according to the conventional art.

By dividing adjacent pixels into one macro-pixel unit and applying transfer with the macro-pixel unit, transfer of all macro pixels at once may be possible. Accordingly, transfer efficiency may be improved.

The transfer method according to the embodiment of the present disclosure has the advantage of increasing transfer efficiency while maintaining a physical size and a fill factor.

In addition, depending on the characteristics of the light emitter, it may be necessary to minimize light interference between display pixels. FIG. 14B shows an example of disposing a sub-pixel area to the outside when it is necessary to reduce light interference between display pixels. At this time, a barrier may be formed on a cover layer to reduce light interference between display pixels. Referring to FIG. 14B, each of m×n display pixels Px1b, Px2b, Px3b, and Px4b within a macro pixel 1430 includes sub-pixel areas 1431, 1433, 1435, and 1437.

The light-emitting element disposed in the sub-pixel areas 1431, 1433, 1435, and 1437 includes one red (R) sub-pixel, one green (G) sub-pixel, and one blue (B) sub-pixel. As previously explained, various combinations of the type and number of sub-pixels disposed in one display pixel are possible.

The sub-pixel areas 1431, 1433, 1435, and 1437 are disposed further out from a center 1430-1 of the macro pixel 1430 than the general sub-pixel area (e.g., 1431-1).

In FIG. 14B, the arrows around the center 1430-1 indicate that the sub-pixel areas 1431, 1433, 1435, and 1437 may be disposed further away than the general sub-pixel area.

Figure 15:
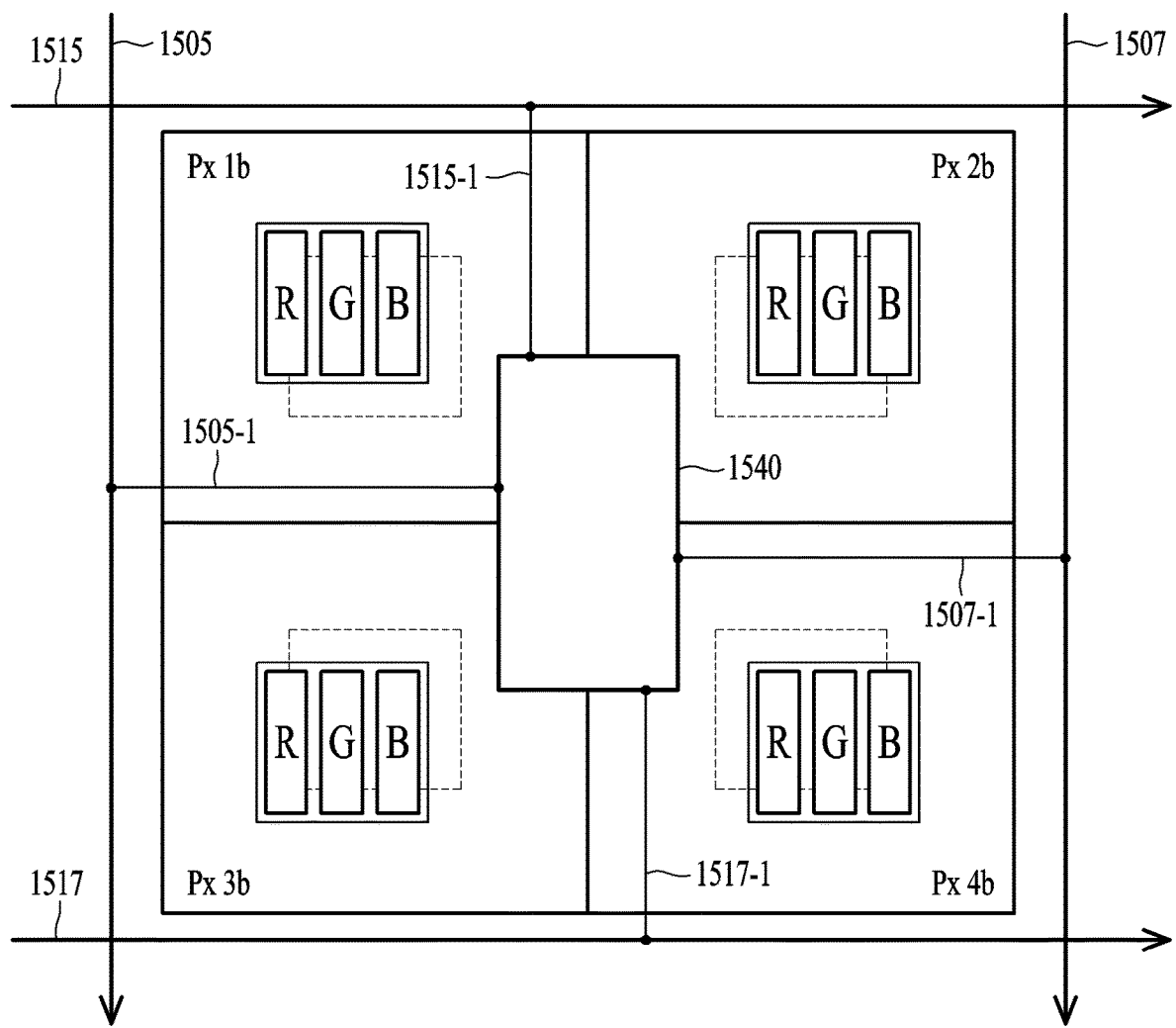
FIG. 15 is a diagram for illustrating macro pixel operation applicable to the display array configuration of FIG. 14B.

FIG. 15 is a diagram for illustrating macro pixel operation applicable to the display array configuration of FIG. 14B.

Referring to FIG. 15, a pixel-driving circuit 1540 may have the same configuration as the pixel-driving circuit 1020 of FIG. 10 or the pixel-driving circuit 1120 of FIG. 11.

Accordingly, the pixel-driving circuit 1540 may include one common element or two common elements. The pixel-driving circuit 1540 may include four pixel-individual elements.

In addition, the pixels Px1b and Px2b may share a row line 1515 through electrical wiring 1515-1. The pixels Px3b and Px4b may share a row line 1517 through electrical wiring 1517-1.

The pixels Px1b and Px3b may share a column line 1505 through electrical wiring 1505-1. The pixels Px2b and Px4b may share a column line 1507 through electrical wiring 1507-1.

According to the structure of FIG. 15, the sub-pixel area is located further outward than in FIG. 10 or FIG. 11. Accordingly, the arrangement process of the pixel-driving circuit 1540 may be advantageous compared to the structure of FIG. 10 or FIG. 11.

Figure 16:
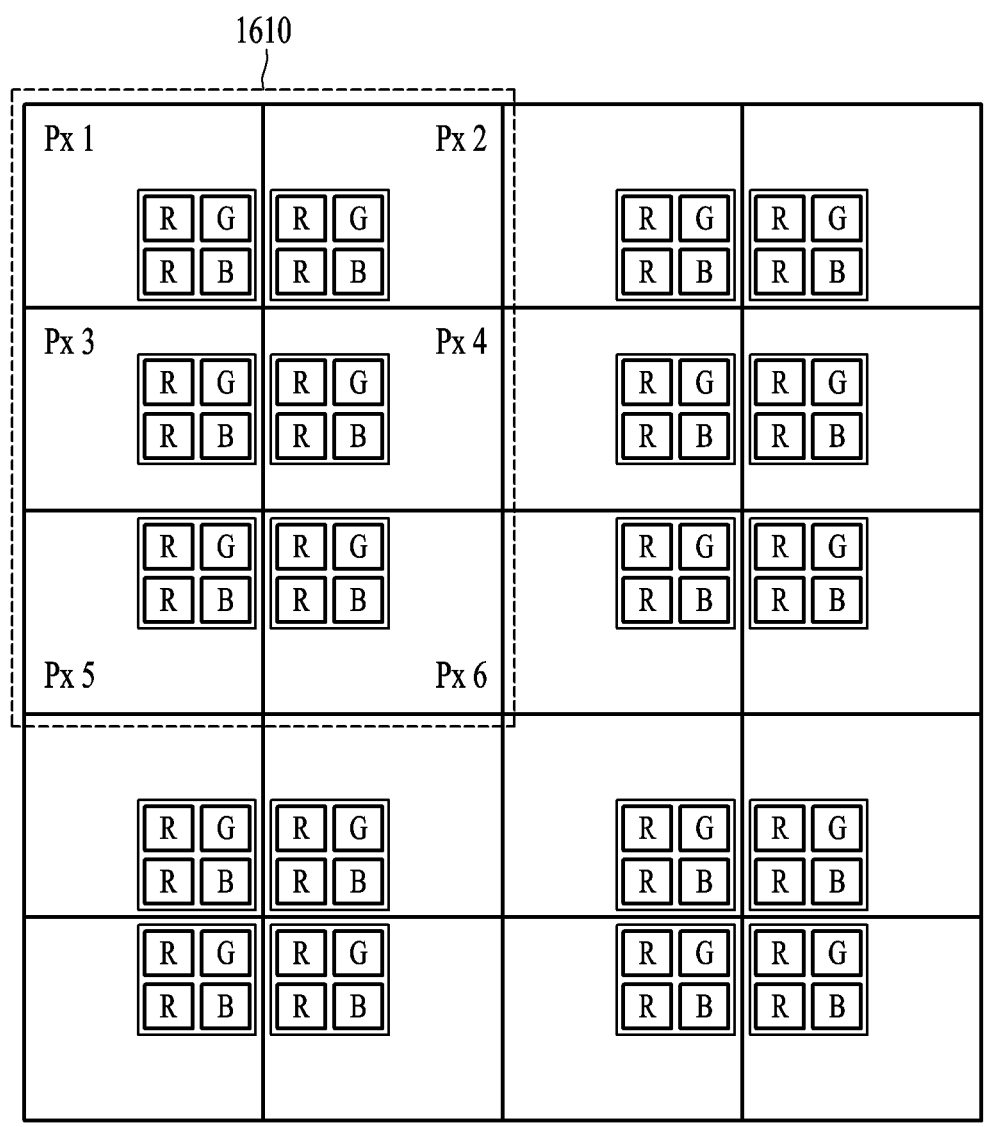
FIG. 16 is a diagram for illustrating another example of a display array configuration according to one embodiment of the present disclosure.

FIG. 16 is a diagram for illustrating another example of a display array configuration according to one embodiment of the present disclosure.

Referring to FIG. 16, a display array according to one embodiment may include a macro pixel 1610 consisting of six display pixels Px1, Px2, Px3, Px4, Px5, and Px6.

Considering the dimension and fill factor of pixels, six or more adjacent pixels may be configured into one macro pixel.

For example, in the case of mobile displays, the sub-pixel area may be increased to increase the fill factor. In addition, sub-pixel areas may be disposed at the outside or corners of the display pixel through the transfer process according to one embodiment.

When the fill factor is designed to be close to 1, that is, the fill factor is close to 100%, a macro pixel may be composed of 8 or more display pixels as a unit.

Figure 17:
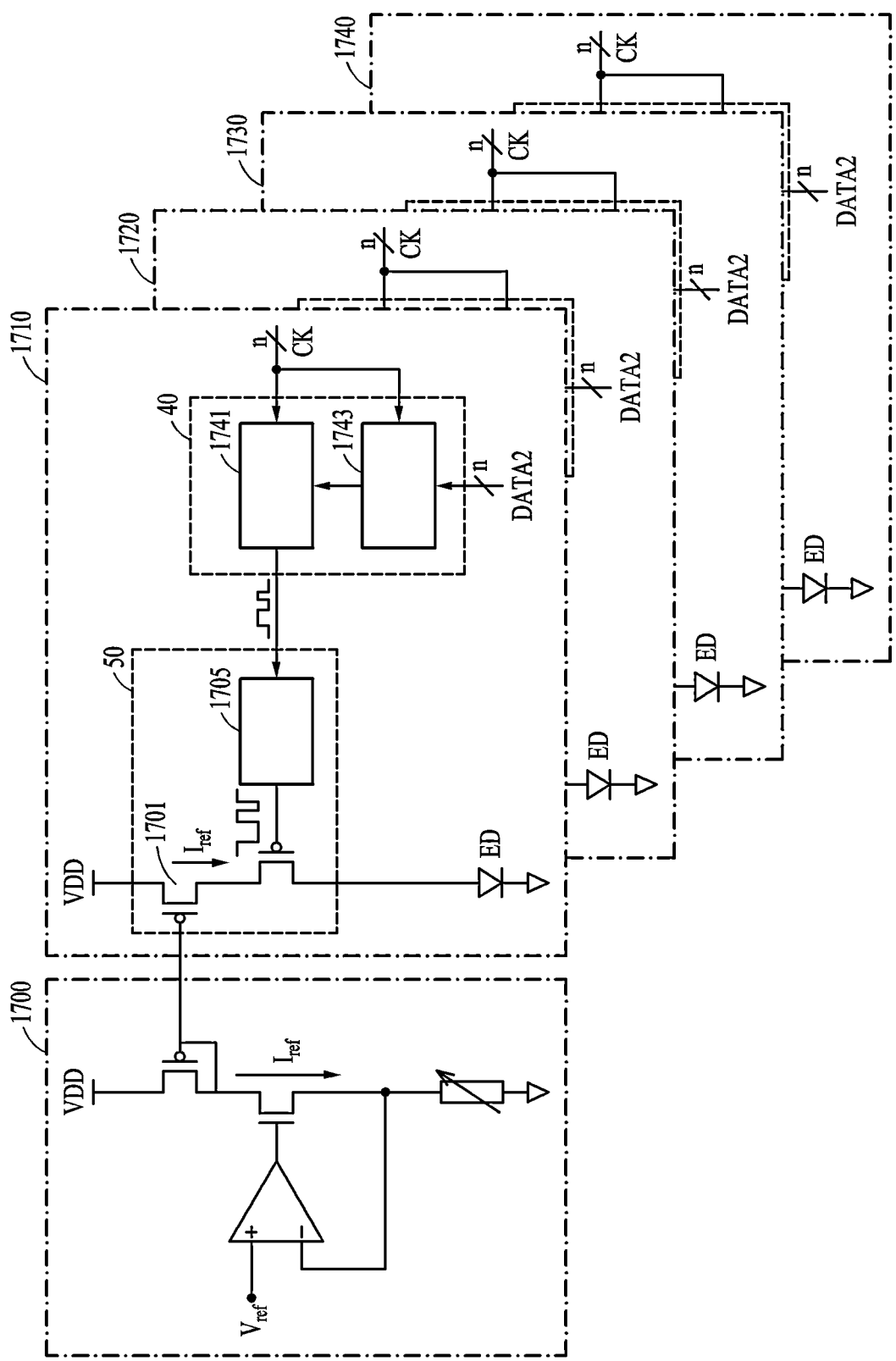
FIG. 17 is a diagram for illustrating the concept of display pixel current driving according to one embodiment of the present disclosure.

FIG. 17 is a diagram for illustrating the concept of display pixel current driving according to one embodiment of the present disclosure.

Referring to FIG. 17, a display pixel 1710 may include a light-emitting element ED and pixel circuits 40 and 50.

The display pixels 1710, 1720, 1730, and 1740 may be display pixels within the macro pixel.

Reference numeral 1700 indicates a current source. A current source 1700 may supply a stable driving current by forming a current mirror with a transistor 1701 in the pixel circuit.

The pixel circuits 40 and 50 may respond to a control signal, e.g., a PWM signal, and determine whether the light emitter emits light.

The pixel circuits 40 and 50 may include a level shifter 1705.

The transistor 1701 may output a driving current. The gate of the transistor 1701 may be connected to the transistor of the current source 1700 and may form a current mirror circuit with the current source 1700.

The additional transistor in the pixel circuits 40 and 50 may be turned on or off depending on a voltage output from the level shifter 1705.

The level shifter 1705 may be connected to the output terminal of a pulse width modulation (PWM) controller 1701 and may generate a second PWM signal by converting the voltage level of a first PWM signal output from the PWM controller 1741. The level shifter 1705 may generate the second PWM signal that converts the first PWM signal into a gate-on voltage level signal for turning on the transistor and a gate-off level signal for turning off the transistor.

The pulse voltage level of the second PWM signal output by the level shifter 1705 may be higher than the pulse voltage level of the first PWM signal. The level shifter 1705 may include a boosting circuit that boosts an input voltage. The level shifter 1705 may be implemented as a plurality of transistors.

Depending on the pulse width of the first PWM signal, the turn-on time and turn-off time of the transistor for one frame may be determined.

The pixel circuit 40 may store the bit value of data applied from a column-driving circuit during a data writing period for each frame, and may generate a first PWM signal based on a bit value and a clock signal during an emission period.

The pixel circuit 50 may include the PWM controller 1741 and a memory 1743.

The PWM controller 1741 may generate a first PWM signal based on a clock signal (CK) input during an emission period and a bit value of data read from the memory 1743.

When a clock signal in subframe units is input, the PWM controller 1741 may read the corresponding data bit value from the memory 1743 and generate a first PWM signal.

The PWM controller 1741 may control the pulse width of a first PWM signal based on the bit value of data in subframe units and the signal width of a clock signal.

For example, when the bit value of video data is 1, the pulse output of a PWM signal may be turned on according to the signal width of a clock signal, and when the bit value of video data is 0, the pulse output of a PWM signal may be turned off according to the signal width of a clock signal.

The PWM controller 1741 may include one or a plurality of logic circuits (e.g., OR gate circuit, etc.) implemented as one or a plurality of transistors.

Figure 18:
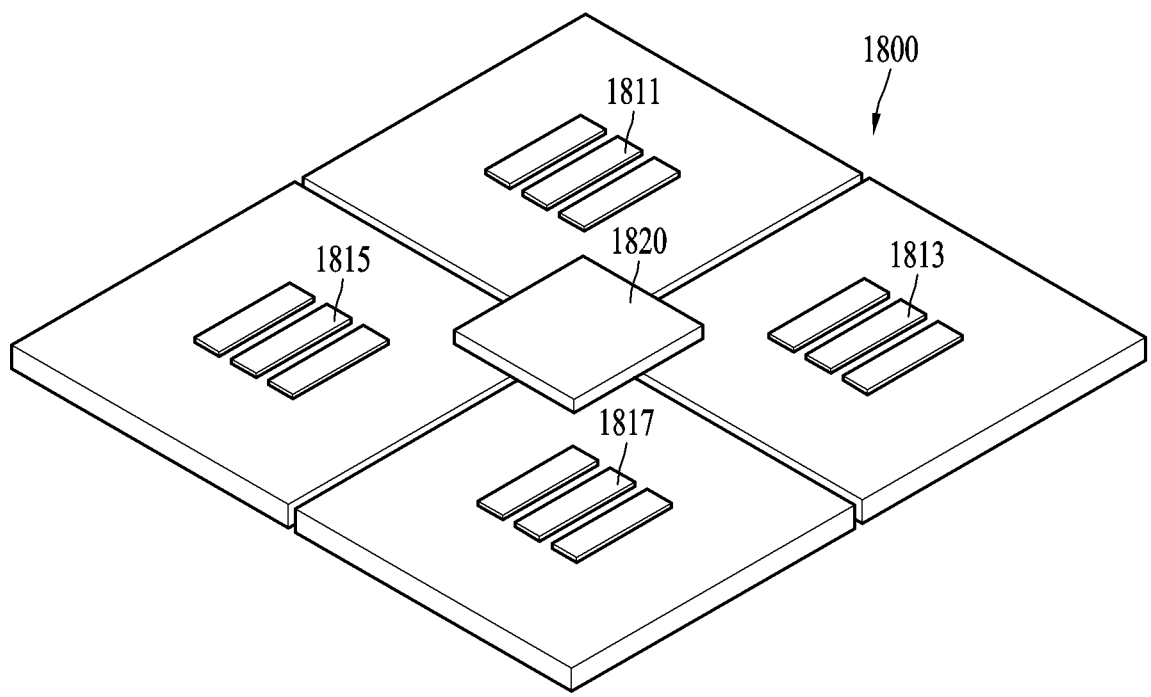
FIGS. 18 to 20 are diagrams for illustrating examples of the arrangement structure of display pixels and pixel-driving circuit according to embodiments of the present disclosure.
Figure 19:
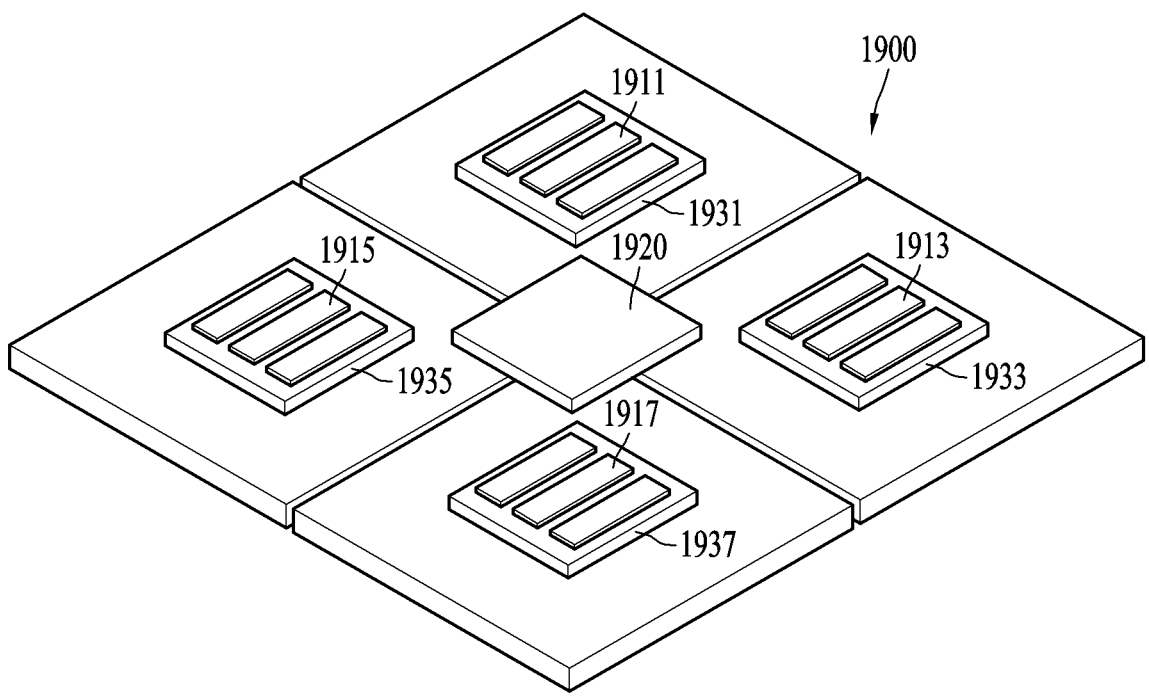
Figure 20:
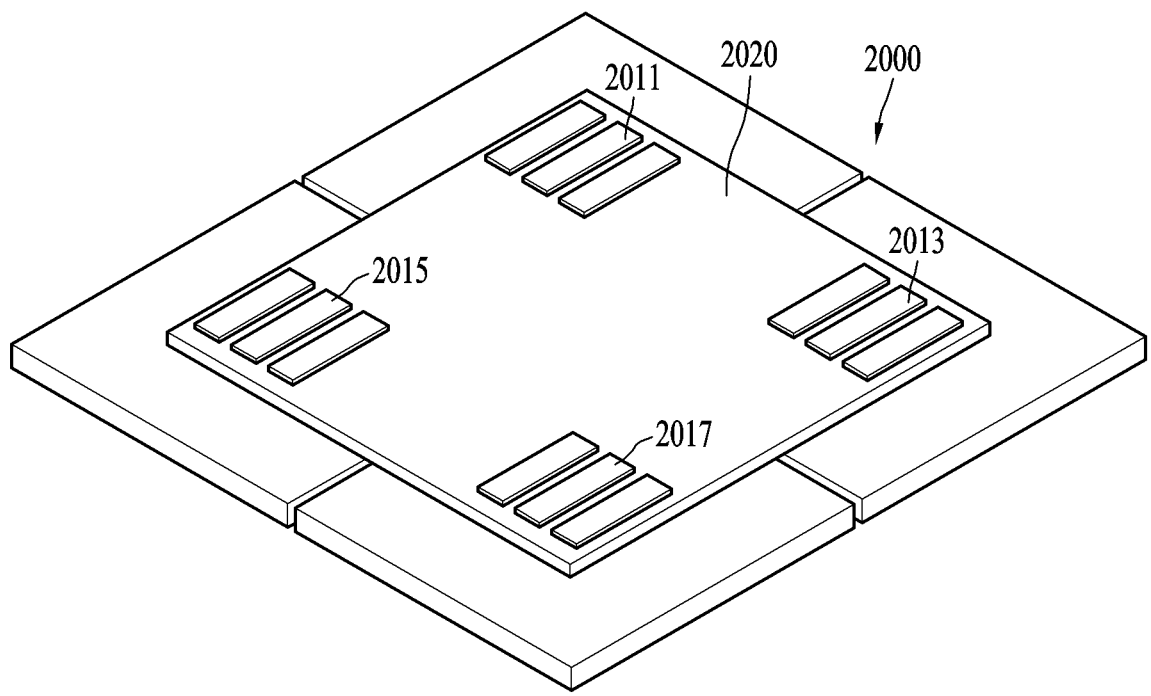

FIGS. 18 to 20 are diagrams for illustrating examples of the arrangement structure of display pixels and pixel-driving circuit according to embodiments of the present disclosure.

Referring to FIG. 18, in a macro pixel 1800, areas where light emitters 1811, 1813, 1815, and 1817 of each display pixel are disposed and a pixel-driving circuit area 1820 are formed on the same layer.

For example, the structure shown in FIGS. 18 may be applied to the examples shown in FIGS. 9, 10, and 11.

Referring to FIG. 19, a macro pixel 1900 includes an area 1920 where a common element is disposed and areas 1931, 1933, 1935, and 1937 where four individual elements are disposed.

At this time, the area 1920 where a common element is disposed and the areas 1931 1933, 1935, and 1937 where four individual elements are disposed may be formed on the same layer. In addition, an area where light emitters 1911, 1913, 1915, and 1917 of a display pixel are disposed may be formed on the areas 1931, 1933, 1935, and 1937 where individual elements are disposed.

The structure shown in FIG. 19 may mainly be applied to the examples shown in FIGS. 9 and 10.

Referring to FIG. 20, a macro pixel 2000 may be applied to structures with a high fill factor.

An area where a common element is disposed and an area where individual elements are disposed may be formed in one area 2020 without distinction.

An area where light emitters 2011, 2013, 2015, and 2017 of the display pixel is disposed and an area 2020 where a pixel-driving circuit is disposed may be formed on different layers.

In FIGS. 18 to 20, at least a portion of the area where the pixel-driving circuit is disposed may be formed to overlap the non-active area of each display pixel. With this configuration, process efficiency and wafer-to-wafer bonding efficiency may be increased.

Figure 21:
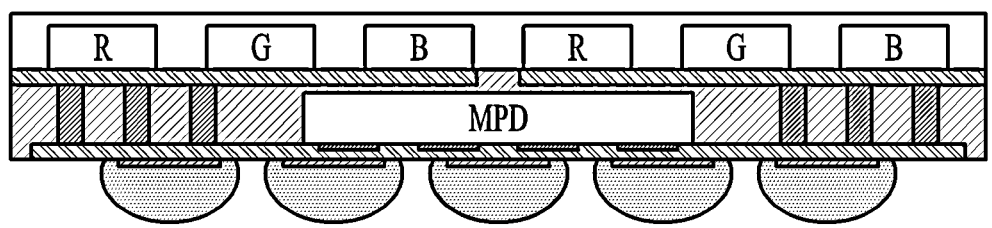
FIG. 21 is a diagram for illustrating a digital display device according to another embodiment.

FIG. 21 is a diagram for illustrating a digital display device according to another embodiment.

Referring to FIG. 21, in the digital display device, each of a plurality of macro pixels may be grouped with each of the corresponding pixel-driving circuits to form a plurality of groups, a pixel-driving circuit MPD corresponding to each of the groups may be embedded in a substrate, and macro pixels R, G, and B corresponding to each of the groups may be formed on the substrate in which the pixel-driving circuit MPD is embedded.

That is, in a digital display device 2100 according to another embodiment, by embedding the pixel-driving circuit MPD in the substrate and optimizing the wiring structure between the pixel-driving circuit MPD and the macro pixels R, G, and B within the substrate, space margin may be secured, and an increase in electrical wiring and device complexity may be minimized.

A method of fabricating the digital display device 2100 according to another embodiment will be described in more detail with reference to FIGS. 22A to 22I below.

FIGS. 22A to 22I are diagrams for illustrating a first fabrication method for a digital display device according to another embodiment.

Referring to FIGS. 22A to 22I, according to the fabrication method, in step 2210, a redistribution layer (RDL) may be formed on a carrier substrate. Here, the RDL may correspond to the lower wiring of a display substrate.

For example, according to the fabrication method, in step 2210, a previously manufactured RDL film may be attached to the carrier substrate.

In addition, according to the fabrication method, in step 2210, after coating the carrier substrate with a liquid coating material capable of RDL wiring, the RDL may be formed by exposing the wiring and performing deposition and plating using a conductive material such as copper (Cu).

Next, according to the fabrication method, in step 2220, a pixel-driving circuit MPD may be attached to a preset position on the carrier substrate on which the RDL is formed.

Next, according to the fabrication method, in step 2230, an insulating layer (molding) may be formed so that the pixel-driving circuit MPD is embedded.

Next, according to the fabrication method, in step 2240, a plurality of vias may be formed by etching the preset via formation area of the insulating layer.

Next, according to the fabrication method, in step 2250, through an RDL process, upper wiring may be formed on the upper portion of the insulating layer, and the upper wiring and lower wiring may be interconnected by filling a plurality of vias with a conductive material (e.g., copper, etc.).

That is, according to the fabrication method, in step 2250, a display substrate with the embedded pixel-driving circuit MPD may be formed.

Next, according to the fabrication method, in step 2260, light-emitting elements R, G, and B may be formed on the upper portion of the display substrate.

That is, according to the fabrication method, in step 2260, LEDs corresponding to each macro pixel may be attached to an area corresponding to the upper wiring.

Next, according to the fabrication method, in step 2270, molding may be formed on the upper surface of the display substrate on which the light-emitting elements R, G, and B are formed.

Next, according to the fabrication method, in step 2280, the carrier substrate may be separated from the display substrate, and a plurality of solder balls or bumps may be formed in the area corresponding to the lower wiring on the lower surface of the display substrate where the carrier substrate is separated.

Accordingly, according to the fabrication method, as shown in step 2290, a pixels-on-driver (POD) structure in which the pixel-driving circuit MPD is embedded in the display substrate and the light-emitting elements R, G, and B are disposed on the upper portion of the substrate may be implemented.

Figure 23A:
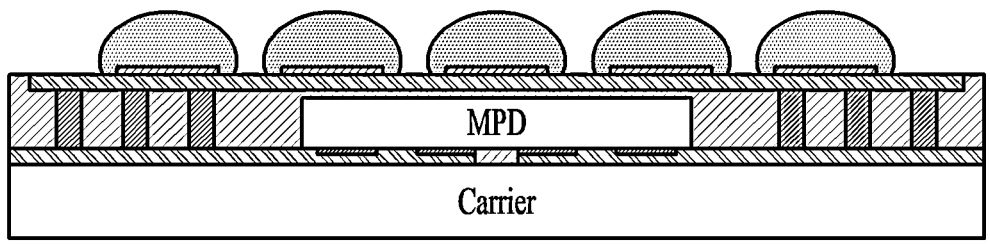
FIGS. 23A and 23B are diagrams for illustrating a second fabrication method for a digital display device according to another embodiment.
Figure 23B:
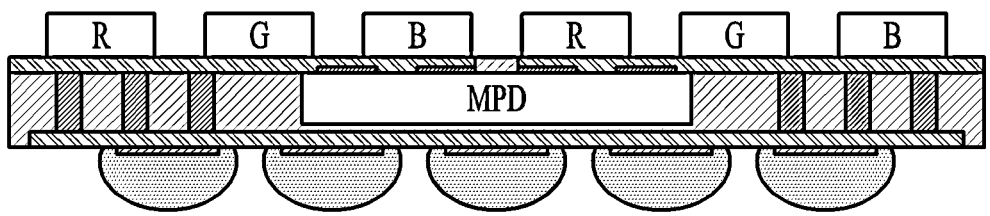

FIGS. 23A and 23B are diagrams for illustrating a second fabrication method for a digital display device according to another embodiment.

Figure 22A:
FIGS. 22A to 22I are diagrams for illustrating a first fabrication method for a digital display device according to another embodiment.
Figure 22B:
Figure 22C:
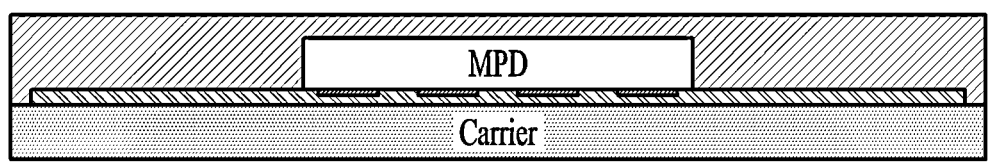
Figure 22D:
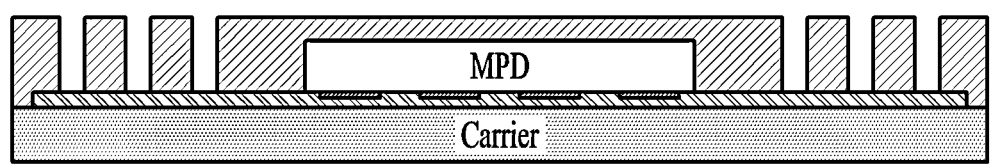
Figure 22E:
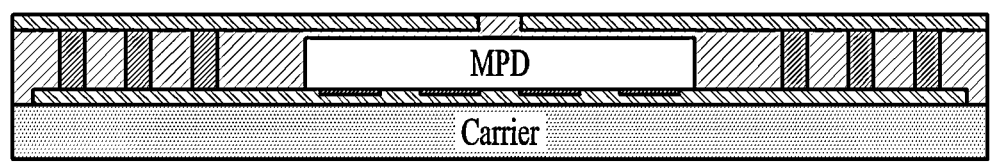
Figure 22F:
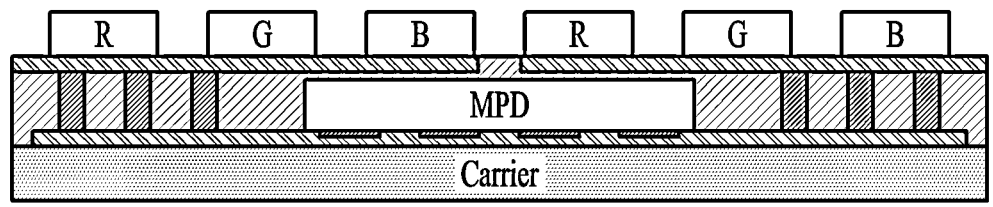
Figure 22G:
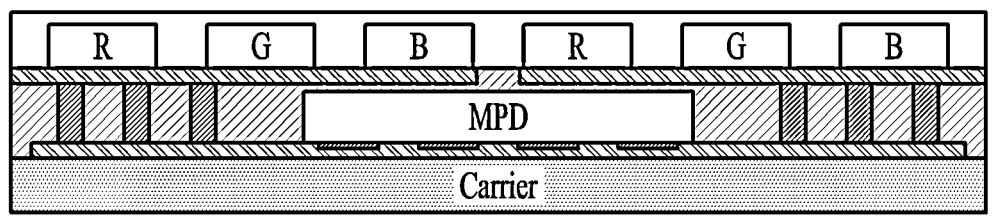
Figure 22H:
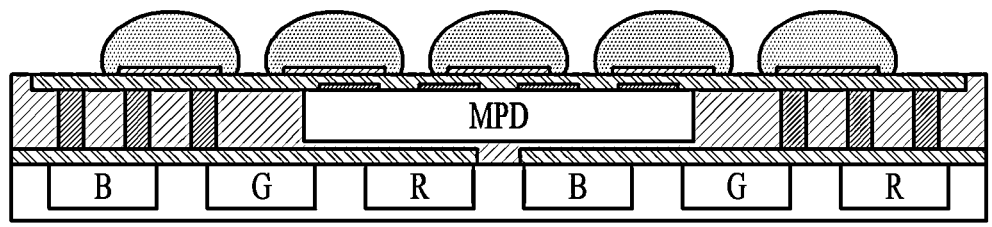
Figure 22I:
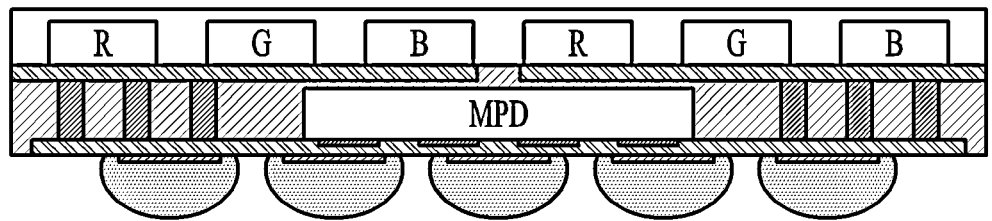

Referring to FIGS. 23A and 23B, a second fabrication method for a digital display device according to another embodiment may be performed after step 2250 of FIG. 22E.

Specifically, according to the fabrication method, in step 2310, a solder ball or bump may be formed in an area corresponding to upper wiring on the upper surface of the display substrate with the pixel-driving circuit MPD.

For example, according to the fabrication method, in step 2310, an input pad solder ball or bump corresponding to an input signal may be formed on the display substrate.

Next, according to the fabrication method, in step 2320, the carrier substrate may be separated from the display substrate, and light-emitting elements R, G, and B may be formed in an area corresponding to the lower wiring on the lower surface of the display substrate from which the carrier substrate is separated.

In addition, according to the fabrication method, in step 2320, to protect the light-emitting elements R, G, and B formed on the display substrate, molding may be formed based on a coating and curing process.

That is, unlike the first fabrication method in which the pixel-driving circuit MPD is attached to the first side (the side where the solder ball or bump is formed) of the display substrate, in the second fabrication method for a digital display device according to another embodiment, the pixel-driving circuit MPD may be attached to the second side (the side where the light-emitting elements R, G, and B are formed) of the display substrate. With this configuration, the pixel-driving circuit MPD may be connected to the light-emitting devices R, G, and B without passing through a via.

Figure 24:
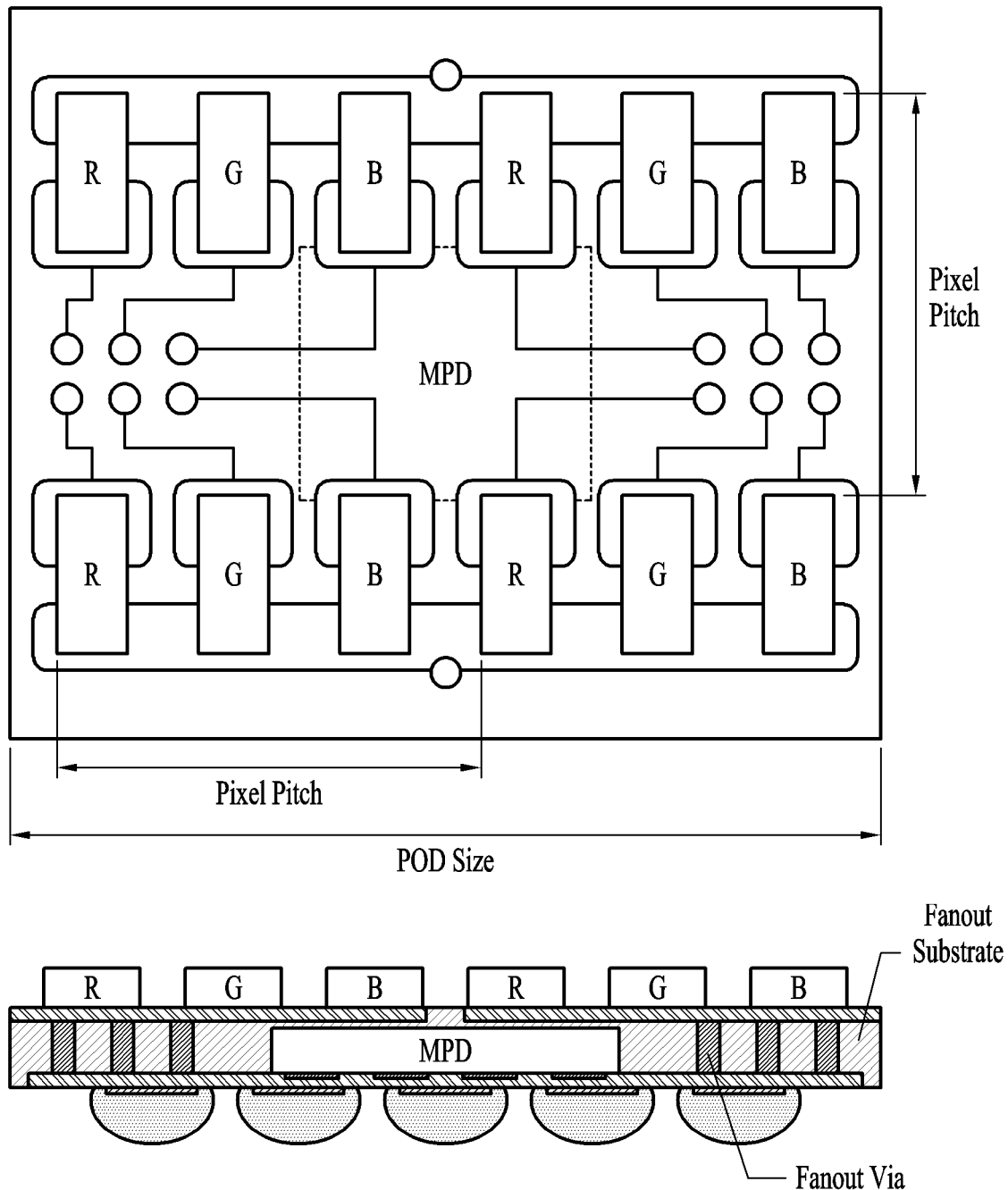
FIG. 24 includes diagrams for further illustrating a digital display device according to another embodiment.

FIG. 24 includes diagrams for further illustrating a digital display device according to another embodiment.

Referring to FIG. 24, a digital display device 2400 according to another embodiment may be implemented as a POD structure in which a driver IC, i.e., a pixel-driving circuit MPD, is embedded in a substrate, and macro pixels R, G, and B are disposed on the substrate. By optimizing the wiring structure between the pixel-driving circuit MPD and the macro pixels R, G, and B within the substrate, space margin may be secured, and an increase in electrical wiring and device complexity may be minimized.

Specifically, the digital display device has a 2×2 structure and consists of the three pixels R, G, and B as one macro pixel. The digital display device has the advantage of simplifying the overall wiring by reducing the number of contacts for driving the pixels when driven by a pixel-driving circuit MPD, i.e., a driver IC.

However, in cases where a pixel pitch is very small, such as micro LED or mini LED, as the number of pixels controlled by a driver pixel-driving circuit MPD increases, it is difficult to form a via for the connection between the pixel-driving circuit MPD and the LED (i.e., light-emitting element) and the connection between the pixel-driving circuit MPD and the display substrate (e.g., PCB). In addition, due to a very fine pitch, it is difficult to insulate from adjacent terminals when forming bumps, which may cause problems such as short circuits.

Accordingly, a digital display device 2300 according to another embodiment may be implemented as a 3-metal fan-out structure capable of mounting light-emitting elements on the pixel-driving circuit MPD. Through this configuration, even when the number of pixels controlled by the pixel-driving circuit MPD increases, light-emitting elements may be arrayed at a smaller pitch, and vias and bumps for connecting the pixel-driving circuit MPD and the light-emitting element/display substrate may be formed in a 3D structure, making it possible to arrange a pixel array at a fine pitch.

In addition, the digital display device 2300 according to another embodiment may be applied to small and medium-sized display devices such as smartphones, laptops, and smartwatches. However, the present disclosure is not limited thereto, and the digital display device 2300 may be easily applied to large or small display devices.

Figure 25:
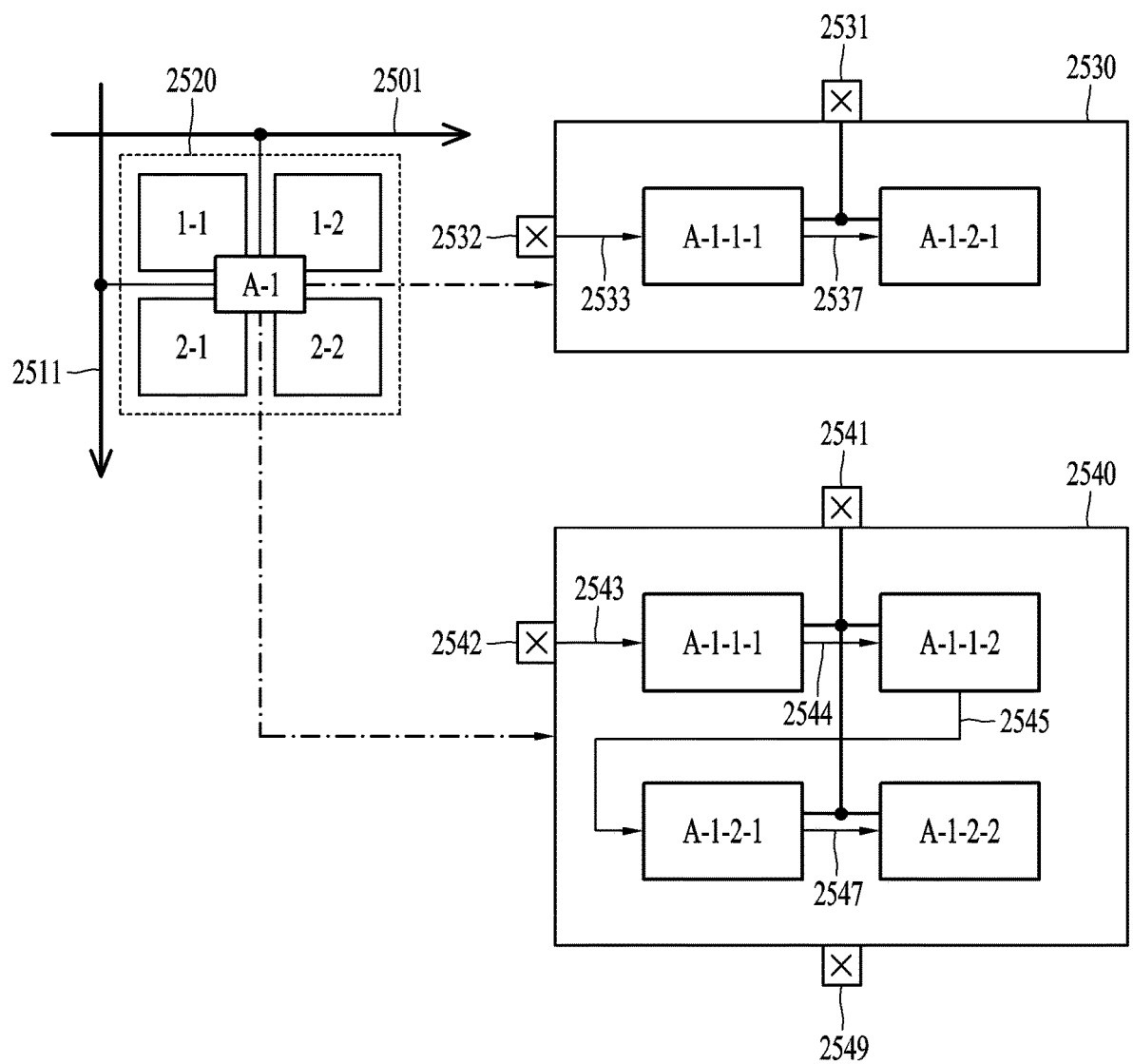
FIG. 25 is a diagram for illustrating a macro pixel and a pixel-driving circuit according to one embodiment.

FIG. 25 is a diagram for illustrating a macro pixel and a pixel-driving circuit according to one embodiment.

Referring to FIG. 25, a macro pixel 2520 may be the first macro pixel 620 of FIG. 6. In addition, the macro pixel 2520 may be any one of the macro pixels shown in FIGS. 9 to 11. Accordingly, in FIG. 25, reference symbol A-1 may indicate a common interface-based pixel-driving circuit for driving the macro pixel 2520.

The common interface-based pixel-driving circuit according to an embodiment of the present disclosure includes a row terminal, a column terminal, and a display pixel-driving element.

The pixel-driving element may drive a plurality of light emitters included in each of adjacent display pixels based on signals input through the column terminal and the row terminal.

Here, the pixel-driving element may include the common element 810 of FIG. 8A. In addition, the pixel-driving element may include pixel individual elements for driving each of a plurality of display pixels.

For example, the display pixel-driving element may include a first pixel individual element for driving a first display pixel among the display pixels and a second pixel individual element for driving a second display pixel among the display pixels.

The display pixel-driving element may include a first shift register for storing data about the first display pixel among the display pixels and a second shift register for storing data about the second display pixel among the display pixels.

The pixel-driving circuit A-1 may drive the macro pixel 2520 using a signal input through a column line 2511 and a signal input through a row line 2501.

The pixel-driving circuit A-1 may include 2L pixel individual elements for driving a plurality of light emitters included in each of adjacent 2L (L is an integer) display pixels. At this time, each of the 2L pixel individual elements may include a pixel-embedded memory that stores video data. The pixel-embedded memory may be a shift register.

Here, for a first-type pixel-driving circuit 2530, L is 1, and for a second-type pixel-driving circuit 2540, L is 2. For example, the first-type pixel-driving circuit 2530 may be applied to the examples shown in FIGS. 8A, 8B and/or 9. In addition, the second-type pixel-driving circuit 2540 may be applied to the example shown in FIG. 11.

The first-type pixel-driving circuit 2530 and the second-type pixel-driving circuit 2540 may further include the common element 810 shown in FIG. 8A. However, the following explanation will focus on components necessary for the operation of writing data to the pixel individual element and light emission operation.

The first-type pixel-driving circuit 2530 may include a row terminal 2531 connected to the row line 2501 of the row-driving circuit.

The first-type pixel-driving circuit 2530 may include a column terminal 2532 connected to the column line 2511 of the column-driving circuit.

The first-type pixel-driving circuit 2530 may include pixel individual elements A-1-1-1 and A-1-2-1 for driving display pixels 1-1 and 2-1.

The pixel individual element A-1-1-1 may be connected through the column terminal 2532 and a serial line 2533, and may transmit N bits of video data to pixel individual element A-1-2-1 through a serial line 2537.

The pixel individual elements A-1-1-1 and A-1-2-1 may share signals input through the row terminal 2531.

The principle of N-bit video data transmission and sharing of signals input through a row terminal is explained in detail below through the second-type structure because the first and second types are the same.

The second-type pixel-driving circuit 2540 may include 2L pixel individual elements for driving a plurality of light emitters included in each of adjacent 2L (L is 2) display pixels.

The first pixel individual element A-1-1-1 may drive a light emitter included in the display pixel 1-1.

The second pixel individual element A-1-1-2 may drive a light emitter included in the display pixel 1-2.

The third pixel individual element A-1-2-1 may drive a light emitter included in the display pixel 2-1.

The fourth pixel individual element A-1-2-2 may drive a light emitter included in the display pixel 2-2.

The second-type pixel-driving circuit 2540 may include a row terminal 2541 connected to the row line 2501 of the row-driving circuit.

The second-type pixel-driving circuit 2540 may include a column terminal 2542 connected to the column line 2511 of the column-driving circuit.

The first pixel individual element A-1-1-1 is connected through a column terminal 2042 and a serial line 2543. The first pixel individual element A-1-1-1 may include a first shift register capable of storing N bits of video data. The first pixel individual element A-1-1-1 stores N bits of video data by sequentially shifting data input by 1 bit through the serial line 2543.

The second pixel individual element A-1-1-2 is connected to the first pixel individual element A-1-1-1 through a serial line 2544. The second pixel individual element A-1-1-2 may include a second shift register capable of storing N bits of video data. At this time, the last bit of the first shift register may be connected in series to the first bit of the second shift register.

The third pixel individual element A-1-2-1 is connected to the second pixel individual element A-1-1-2 through a serial line 2545. The third pixel individual element A-1-2-1 may include a third shift register capable of storing N bits of video data. At this time, the last bit of the second shift register may be connected in series to the first bit of the third shift register.

The fourth pixel individual element A-1-2-2 is connected to the third pixel individual element A-1-2-1 through a serial line 2547. The fourth pixel individual element A-1-2-2 may include a fourth shift register capable of storing N bits of video data. At this time, the last bit of the third shift register may be connected in series to the first bit of the fourth shift register.

In addition, the second-type pixel-driving circuit 2540 may further include a row terminal 2549 for sharing a row signal for each of two pixel individual elements. When sharing a row signal through two row terminals, A-1-1-1 and A-1-1-2 may share a signal input through the row terminal 2541. In addition, when sharing a row signal through two row terminals, A-1-2-1 and A-1-2-2 may share a signal input through a row terminal 2549.

Figure 26:
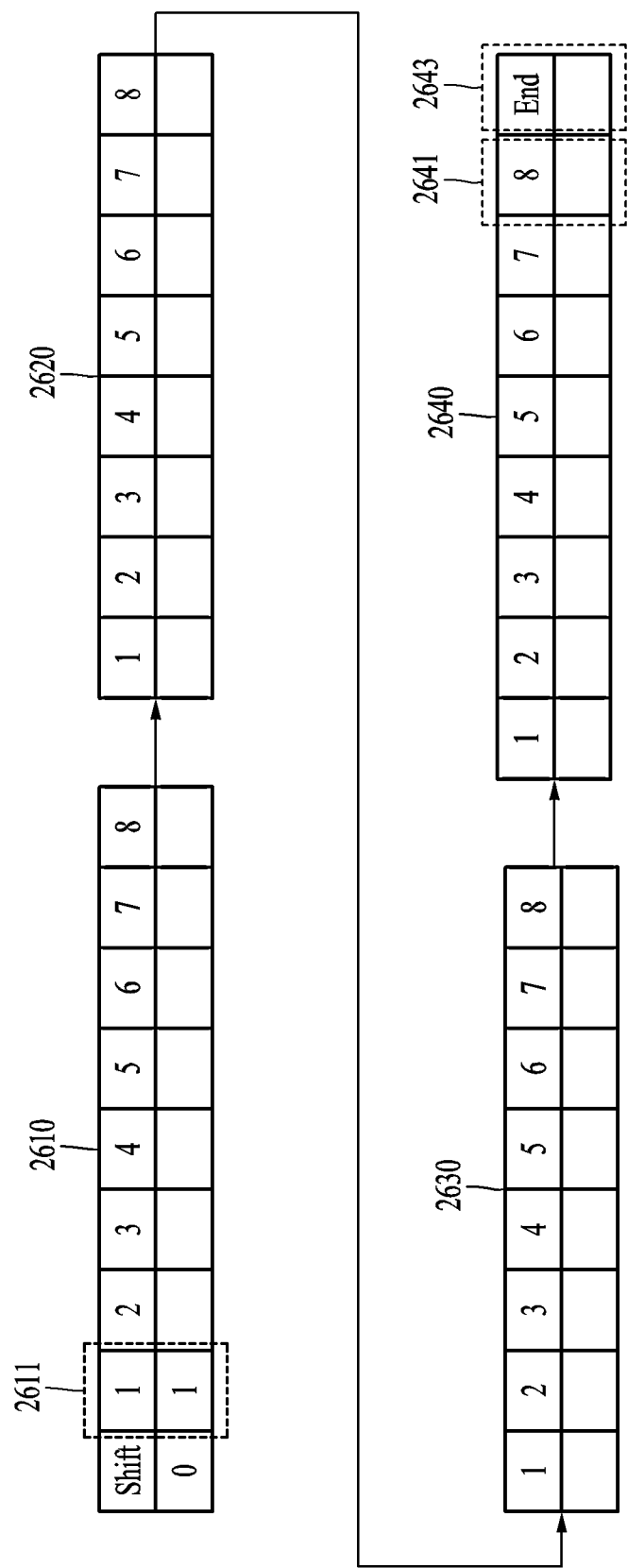
FIG. 26 is a diagram for illustrating the schematic structure of a pixel-embedded memory for driving a macro pixel according to one embodiment.
Figure 27:
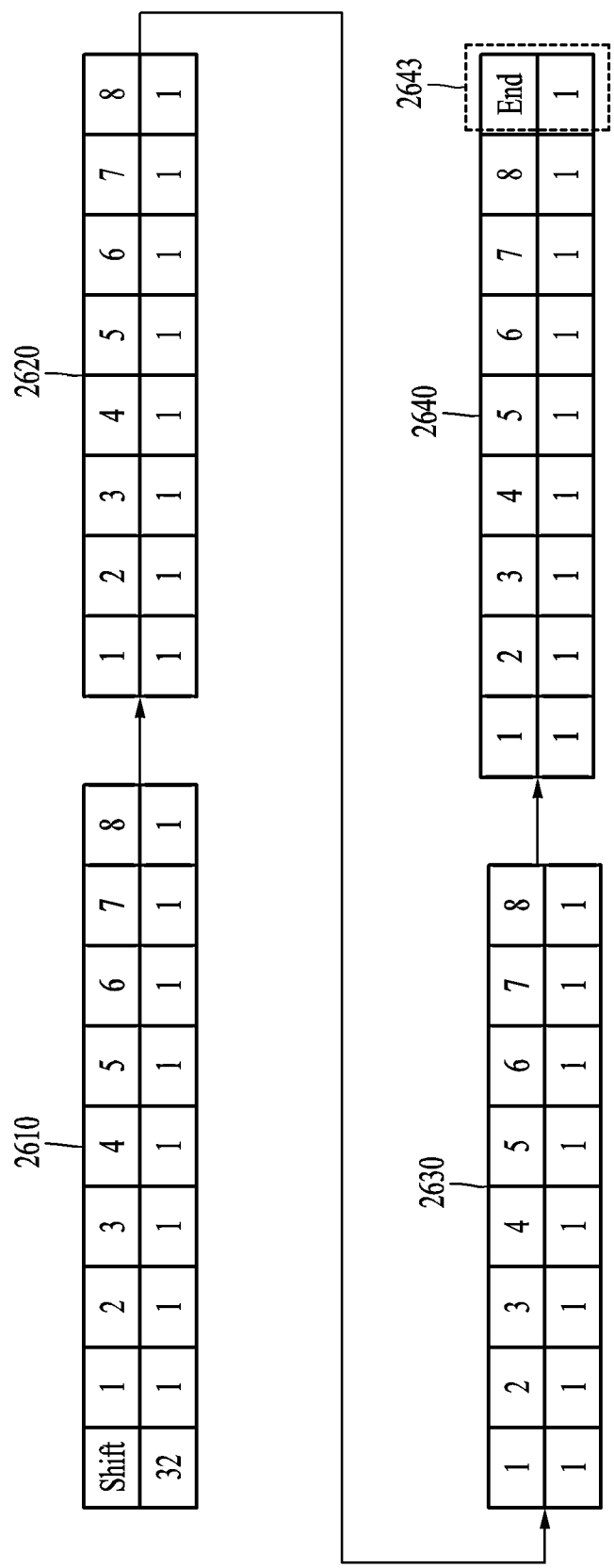
FIG. 27 is a diagram for illustrating the operation method of the pixel-embedded memory shown in FIG. 26.

FIGS. 26 and 27 are diagrams for illustrating the schematic structure and operation method of a pixel-embedded memory for driving a macro pixel according to one embodiment.

Referring to FIG. 26, a first shift register 2610 may be embedded in the first pixel individual element A-1-1-1 of FIG. 25. A second shift register 2620 may be embedded in the second pixel individual element A-1-1-2 of FIG. 25. A third shift register 2630 may be embedded in the third pixel individual element A-1-2-1 of FIG. 25. A fourth shift register 2640 may be embedded in the fourth pixel individual element A-1-2-2 of FIG. 25.

When the write operation of the column-driving circuit begins, video data is input starting from a first bit 2611 of the first shift register 2610. While the write operation input to the first bit 2611 of the first shift register 2610 is in progress, sequential shifting occurs, and the video data is finally stored in the last bit 2641 of the fourth shift register 2140.

The fourth shift register 2140 may further include an end bit 2643. When data is shifted to the end bit 2643, the write operation for the macro cell ends and the shift operation of each shift register stops.

Figure 28:
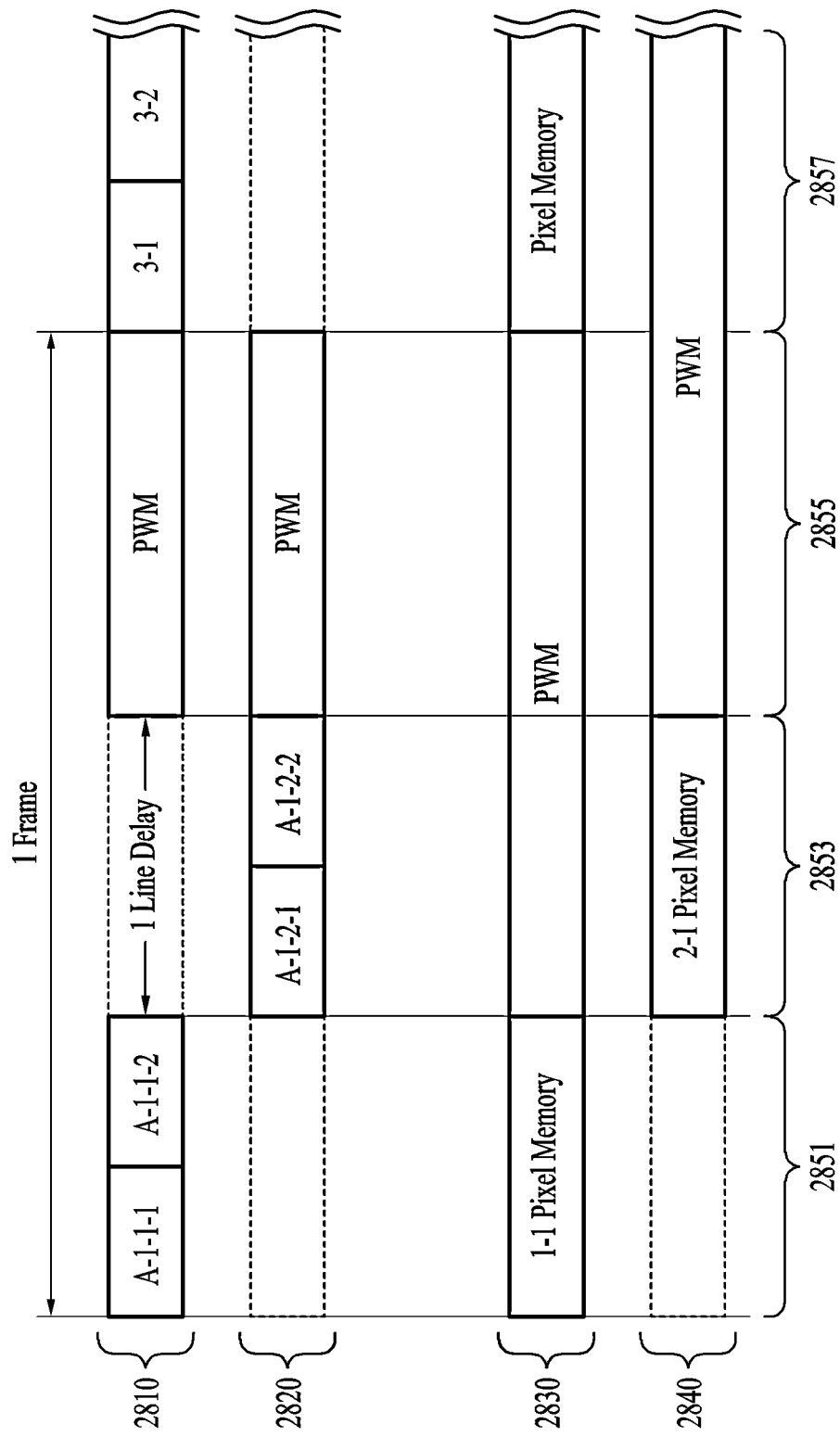
FIG. 28 is a diagram for illustrating the write and read operations of a pixel-embedded memory for driving a macro pixel according to one embodiment.

FIG. 28 is a diagram for illustrating the write and read operations of a pixel-embedded memory for driving a macro pixel according to one embodiment.

Referring to FIG. 28, reference numeral 2810 represents a timing diagram of write and read operations of the display pixels 1-1 and 1-2 shown in FIG. 25 in one frame.

Reference numeral 2820 represents a timing diagram of write and read operations of the display pixels 2-1 and 2-2 shown in FIG. 25 in one frame.

Reference numeral 2830 represents a timing diagram of write and read operations for a single pixel 1-1 according to the prior art.

Reference numeral 2840 represents a timing diagram of write and read operations for a single pixel 2-1 according to the prior art. At this time, a read operation for the single pixel 2-1 may be performed during times 2855 and 2857 during which a PWM signal is applied.

When a write operation begins, N bits of data input through the column terminal may be shifted from the pixel-embedded memory of the first pixel individual element to the pixel-embedded memory of the second pixel individual element at a first line time 2851.

For example, when N is 8, 16 bits of data may be input sequentially during the first line time 2851, 8 bits of data may be stored in the first pixel individual element A-1-1-1, and 8 bits of data may be stored in the second pixel individual element A-1-1-2.

At this time, '1 Line time' may be a fixed time determined depending on display frequency and resolution. For example, '1 Line time' may be determined by frame frequency/line number. At this time, the 'number of lines' may be N in the case of display pixels disposed into M rows and N columns.

Data stored in the first pixel individual element A-1-1-1 and the second pixel element A-1-1-2 may be shifted to the third pixel individual element A-1-2-1 and the fourth pixel individual element A-1-2-2 during a second line time 2853.

That is, the third pixel individual element connected in series to the second pixel individual element may receive N bits of data at the second line time 2853 and may shift N bits of data to the pixel-embedded memory of the fourth pixel individual element.

The first pixel individual element and the second pixel individual element enable the pulse width modulation (PWM) signal input through the row terminal after a delay of the preset time.

Preset delay is necessary for effective operation of the macro pixel. For example, in the '1-Line Delay' section, data shift operations of the third pixel individual element and fourth pixel individual element may be performed, and a row signal may be shared.

The third pixel individual element and the fourth pixel individual element enable the PWM signal input through the row terminal after the second line time when the data shift operation of the pixel-embedded memory of the fourth pixel individual element is completed.

Accordingly, light-emitting elements within a macro pixel may emit light for a time 2855 when a PWM signal is applied.

According to one embodiment, it can be seen that a write operation is performed on two display pixels 1-1 and 1-2 during the same time that a write operation on a single pixel 1-1 according to the prior art is performed on the 1-1 pixel memory.

Figure 29:
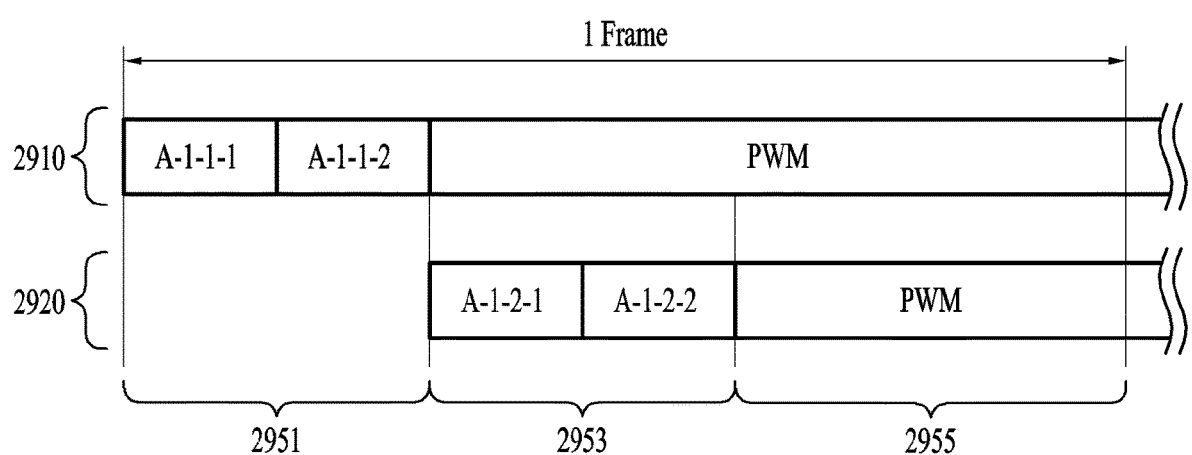
FIG. 29 shows another example for illustrating the write and read operations of a pixel-embedded memory for driving a macro pixel according to one embodiment.

FIG. 29 shows another example for illustrating the write and read operations of a pixel-embedded memory for driving a macro pixel according to one embodiment.

FIG. 29 shows an example of inputting a row signal through the two row terminals 2541 and 2549 of FIG. 25.

At this time, the first pixel individual element may receive N bits of data at a first line time 2951, and may shift the N bits of data to the pixel-embedded memory of the second pixel individual element.

In addition, the third pixel individual element connected in series to the second pixel individual element may receive N bits of data at a second line time 2953, and may shift the N bits of data to the pixel-embedded memory of the fourth pixel individual element.

When a row signal is input through the two row terminals 2541 and 2549, unlike the example shown in FIG. 28, the pixel individual elements enable a PWM signal without 1 line delay.

Accordingly, the two pixel display within the macro pixel may emit light during times 2953 and 2955 that a PWM signal is applied.

Figure 30:
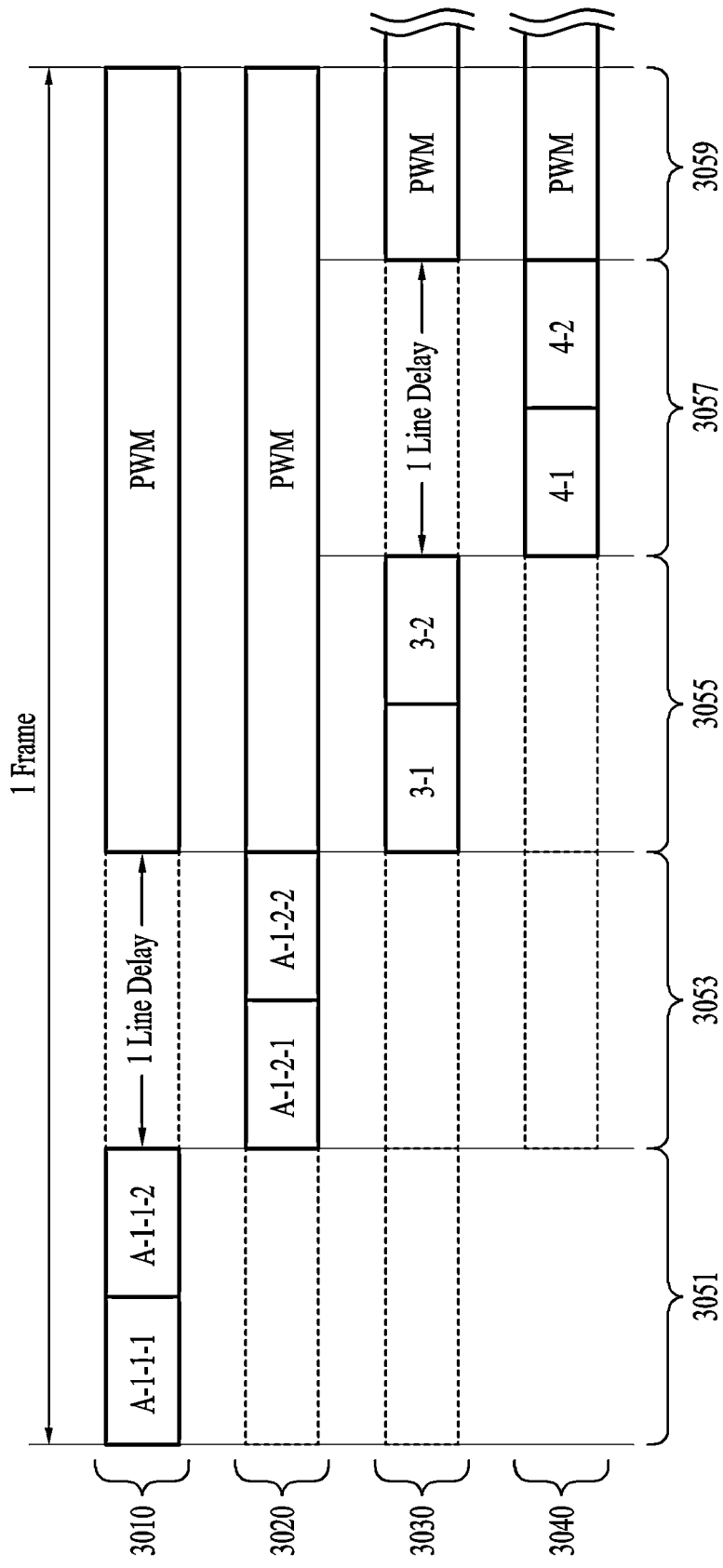
FIG. 30 is a diagram for illustrating the write and read operations of a pixel-embedded memory for two macro pixels according to one embodiment.

FIG. 30 is a diagram for illustrating the write and read operations of a pixel-embedded memory for two macro pixels according to one embodiment.

FIG. 30 shows an example of driving two macro pixels by applying the second-type pixel-driving circuit 2540 shown in FIG. 25.

At this time, one macro pixel is the macro pixel 2520 shown in FIG. 25, and the remaining macro pixel is a macro pixel driven by the pixel-driving circuit B-1 shown in FIG. 6.

Data may be stored in pixel individual elements A-1-1-1 and A-1-1-2 at a first line 3010 during a first line time 3051, and data may be stored in pixel individual elements A-1-2-1 and A-1-2-2 of a second line 3020 during a second line time 3051.

At a third line 3030, data may be stored in a pixel individual element for driving a display pixel 3-1 and a pixel individual element for driving a display pixel 3-2 during a third line time 3055.

At a fourth line 3040, data may be stored in a pixel individual element for driving a display pixel 4-1 and a pixel individual element for driving a display pixel 4-2 during a fourth line time 3057.

In one frame, the display pixel 4-1 and the display pixel 4-2 may emit light for a time 3059 when a PWM signal is enabled.

Referring to FIGS. 25 to 30, the digital display device according to one embodiment may include a pixel cluster including a first pixel and a second pixel.

At this time, the pixel-driving circuit for driving the pixel cluster may include a first contact point (e.g., 2541) for receiving a PWM driving signal and a second contact point (e.g., 2542) for receiving gradation data of the first and second pixels.

At this time, the pixel-driving circuit may be a circuit for driving the light emitters of the first and second pixels included in the pixel cluster.

At this time, the pixel-driving circuit may include a pixel individual element including a shift register.

Accordingly, the gradation data may be stored in the shift register, and the pixel-driving circuit may perform PWM driving of the first and second pixels simultaneously.

For example, the pixel-driving circuit may include a first shift register that stores gradation data for the first pixel and a second shift register that stores gradation data for the second pixel.

At this time, the second shift register may be connected in series to the first shift register, and the first shift register may shift gradation data for the second display pixel to the second shift register at the first line time.

The pixel-driving circuit may receive gradation data of the first and second pixels through the second contact point, store the gradation data of the first pixel in the first shift register, and store the gradation data of the second pixel in the second shift register.

In addition, the pixel-driving circuit may receive the PWM driving signals of the first and second pixels through the first contact point, and may perform simultaneously PWM driving of the first and second pixels according to the gradation data stored in the first and second shift registers.

The apparatus described above may be implemented as a hardware component, a software component, and/or a combination of hardware components and software components. For example, the apparatus and components described in the embodiments may be achieved using one or more general purpose or special purpose computers, such as, for example, a processor, a controller, an arithmetic logic unit (ALU), a digital signal processor, a microcomputer, a field programmable gate array (FPGA), a programmable logic unit (PLU), a microprocessor, or any other device capable of executing and responding to instructions. The processing device may execute an operating system (OS) and one or more software applications executing on the operating system. In addition, the processing device may access, store, manipulate, process, and generate data in response to execution of the software. For ease of understanding, the processing apparatus may be described as being used singly, but those skilled in the art will recognize that the processing apparatus may include a plurality of processing elements and/or a plurality of types of processing elements. For example, the processing apparatus may include a plurality of processors or one processor and one controller. Other processing configurations, such as a parallel processor, are also possible.

Although the present disclosure has been described with reference to limited embodiments and diagrams, it should be understood by those skilled in the art that various changes and modifications may be made therein. For example, the described techniques may be performed in a different order than the described methods, and/or components of the described systems, structures, devices, circuits, etc., may be combined in a manner that is different from the described method, or appropriate results may be achieved even if replaced by other components or equivalents.

Therefore, other embodiments, other examples, and equivalents to the claims are within the scope of the following claims.

The invention claimed is:

1. A pixel-driving circuit for driving a digital display device, the pixel-driving circuit formed on an interposer that is electrically connected to a display substrate through a plurality of bumps, wherein the pixel-driving circuit comprises:
   a row terminal connected to a row bump connected to a row line of a row-driving circuit among the plurality of bumps;
   a column terminal connected to a column bump connected to a column line of a column-driving circuit among the plurality of bumps;
   a common element that shares at least one of the row terminal or the column terminal for L (L is a positive integer greater than or equal to 2) display pixels formed on the interposer; and
   L pixel individual elements connected to the common element and driving a plurality of light emitters included in each of the L display pixels,
   wherein each of the L pixel individual elements comprises a pixel-embedded memory for storing video data to illuminate the L display pixels,
   wherein the common element comprises a power generator for generating power for the pixel-driving circuit; and at least one of a column signal distributor for distributing a signal input through the column terminal to the L pixel individual elements or a row signal distributor for distributing a signal input through the row terminal to the L pixel individual elements, and
   wherein each of the L pixel individual elements comprises a pixel-embedded memory for storing video data input through the column signal distributor.

2. The pixel-driving circuit according to claim 1, wherein the interposer is one of a film interposer, a glass interposer, or a silicon interposer.

3. The pixel-driving circuit according to claim 1, further comprising at least one sensor disposed on a sensor area formed on the interposer.

4. The pixel-driving circuit according to claim 1, wherein sub-pixel areas where a plurality of light emitters of each of the L display pixels are disposed are formed at a corner or outside of a display pixel so that the sub-pixel areas are adjacent to each other.

5. A digital display device, comprising:
   M×N display pixels arranged in M (M is a positive integer) rows and N (N is a positive integer) columns; and
   a plurality of pixel-driving circuits for driving the display pixels, wherein the M×N display pixels are divided into a plurality of macro pixels comprising m×n (m is a positive integer less than M, n is a positive integer less than N) display pixels;
   each of the macro pixels is grouped with each of the corresponding pixel-driving circuits to form a plurality of groups, and the groups are formed on a plurality of interposers that are electrically connected to a substrate through a plurality of bumps; and
   each of the pixel-driving circuits is connected to at least one corresponding row line and at least one corresponding column line, and a signal input through at least one line of the row and column lines is distributed to the m×n display pixels within a macro pixel grouped into the same group,
   wherein each pixel-driving circuit comprises a pixel-embedded memory for storing video data to illuminate a m×n display pixels in a corresponding macro pixel,
   wherein each of the pixel-driving circuits comprises a common element that shares m×n display pixels within a macro pixel grouped into the same group and at least one line of the row and column lines; and m×n pixel individual elements for driving a plurality of light emitters comprised in each of the m×n display pixels within the macro pixel connected to the common element and grouped into the same group, and
   wherein a number of the row and column lines shared with the m×n display pixels is determined based on at least one of a fill factor and an application type of a pixel-driving circuit, and the fill factor is determined based on size design conditions of a pixel area of the display substrate and a sub-pixel area where the light emitters are disposed.

6. The digital display device according to claim 5, wherein the application type of the pixel-driving circuit is divided into a large-area display, a monitor display, and a mobile display, and
   the fill factor is determined to have a small value in an order of a large-area display, a monitor display, and a mobile display.

7. The digital display device according to claim 5, wherein the interposer is any one of a film interposer, a glass interposer, and a silicon interposer.

8. The digital display device according to claim 5, wherein each of the pixel-driving circuits further comprises at least one sensor disposed on a sensor area formed on a corresponding interposer.

9. The digital display device according to claim 5, wherein each of the display pixels is disposed on a pixel area formed on a corresponding interposer;
   the pixel area comprises sub-pixel areas where a plurality of light emitters are disposed and a non-active area excluding the sub-pixel areas; and
   each of the macro pixels comprises a pixel-driving circuit area where a pixel-driving circuit is disposed, and at least a portion of the pixel-driving circuit area overlaps a plurality of non-active areas.

10. The digital display device according to claim 9, wherein the sub-pixel areas are formed at a corner or outside of a display pixel so that the sub-pixel areas are adjacent to each other.

11. The digital display device according to claim 5, wherein each of the m×n pixel individual elements comprises the pixel-embedded memory for storing the video data input through the column signal distributor; and
   a pixel driver for controlling driving of the light emitters based on the video data and a driving signal input through the row signal distributor.

* * * * *